(12) United States Patent
Cha et al.

(10) Patent No.: US 12,185,604 B2
(45) Date of Patent: Dec. 31, 2024

(54) DISPLAY APPARATUS

(71) Applicant: Samsung Display Co., Ltd., Yongin-si (KR)

(72) Inventors: Myounggeun Cha, Yongin-si (KR); Joohee Jeon, Yongin-si (KR); Sanggun Choi, Yongin-si (KR)

(73) Assignee: SAMSUNG DISPLAY CO., LTD., Yongin-si (KR)

(*) Notice: Subject to any disclaimer, the term of this patent is extended or adjusted under 35 U.S.C. 154(b) by 317 days.

(21) Appl. No.: 17/743,424

(22) Filed: May 12, 2022

(65) Prior Publication Data

US 2023/0090817 A1    Mar. 23, 2023

(30) Foreign Application Priority Data

Sep. 17, 2021    (KR) .................. 10-2021-0125209

(51) Int. Cl.
| | | |
|---|---|---|
| H01L 27/32 | (2006.01) | |
| H10K 59/124 | (2023.01) | |
| H10K 59/131 | (2023.01) | |
| H10K 59/13 | (2023.01) | |

(52) U.S. Cl.
CPC ....... *H10K 59/1315* (2023.02); *H10K 59/124* (2023.02); *H10K 59/13* (2023.02)

(58) Field of Classification Search
CPC . H01L 27/124; H10K 59/131; H10K 59/1315
See application file for complete search history.

(56) References Cited

U.S. PATENT DOCUMENTS

| 10,930,725 B2 | 2/2021 | Cha et al. |
| 2021/0098749 A1 | 4/2021 | Choi et al. |
| 2022/0093705 A1 | 3/2022 | Kim et al. |

FOREIGN PATENT DOCUMENTS

| CN | 110544712 | 12/2019 |
| KR | 1020170076184 | * 7/2017 |
| KR | 10-2020-0085962 | 7/2020 |
| KR | 10-2021-0037062 | 4/2021 |

* cited by examiner

*Primary Examiner* — John A Bodnar
(74) *Attorney, Agent, or Firm* — KILE PARK REED & HOUTTEMAN PLLC

(57) ABSTRACT

A display apparatus for displaying a high-resolution image and having a low occurrence rate of defects caused by a voltage drop. The display apparatus includes a substrate, a first conductive layer arranged on the substrate and including an auxiliary data line extending in a first direction, a first semiconductor layer arranged on the first conductive layer, a first gate layer arranged on the first semiconductor layer, a first connection electrode layer arranged on the first gate layer and including a first connection electrode electrically connected to the first semiconductor layer and the auxiliary data line, and a second connection electrode layer arranged on the first connection electrode layer and including a data line electrically connected to the first connection electrode.

20 Claims, 16 Drawing Sheets

DISPLAY APPARATUS

CROSS-REFERENCE TO RELATED APPLICATION

This application claims priority from and the benefit of Korean Patent Application No. 10-2021-0125209, filed on Sep. 17, 2021, which is hereby incorporated by reference for all purposes as if fully set forth herein.

BACKGROUND

Field

Embodiments of the invention relate generally to a display apparatus, and more particularly, to a display apparatus in which a high-resolution image is displayed with a low defect occurrence rate for the types of defects caused by a voltage drop.

Discussion of the Background

In general, in a display apparatus, such as an organic light-emitting display apparatus, thin-film transistors are respectively arranged in (sub-)pixels to control the brightness, etc., of each (sub-)pixel. Such thin-film transistors are configured to control the brightness, etc., of corresponding (sub-)pixels in response to transmitted data signals.

However, in an existing display apparatus, voltages applied to thin-film transistors may drop while data signals, etc., are transmitted to the thin-film transistors.

The above information disclosed in this Background section is only for understanding of the background of the inventive concepts, and, therefore, it may contain information that does not constitute prior art.

SUMMARY

Embodiments of the invention provide a display apparatus in which a high-resolution image is displayed with a low occurrence rate of defects caused by a voltage drop.

Additional features of the invention will be set forth in part in the description which follows and, in part, will be apparent from the description, or may be learned by practice of the presented embodiments of the invention.

An embodiment of the invention provides a display apparatus including a substrate, a first conductive layer arranged on the substrate and including an auxiliary data line extending in a first direction, a first semiconductor layer arranged on the first conductive layer, a first gate layer arranged on the first semiconductor layer, a first connection electrode layer arranged on the first gate layer and including a first connection electrode electrically connected to the first semiconductor layer and the auxiliary data line, and a second connection electrode layer arranged on the first connection electrode layer and including a data line electrically connected to the first connection electrode.

The display apparatus may further include a planarization layer arranged between the first connection electrode layer and the second connection electrode layer, and the data line may be connected to the first connection electrode, which is included in the first connection electrode layer, through a contact hole in the planarization layer.

The display apparatus may further include a first interlayer insulating layer arranged between the first conductive layer and the first semiconductor layer, a first gate insulating layer arranged between the first semiconductor layer and the first gate layer, a second interlayer insulating layer configured to cover the first gate layer, a second conductive layer arranged on the second interlayer insulating layer, a third interlayer insulating layer configured to cover the second conductive layer, a second semiconductor layer arranged on the third interlayer insulating layer, a second gate insulating layer configured to cover the second semiconductor layer, a second gate layer arranged on the second gate insulating layer, a fourth interlayer insulating layer configured to cover the second gate layer, and a planarization layer arranged between the first connection electrode layer and the second connection electrode layer, wherein the first connection electrode layer is arranged on the fourth interlayer insulating layer.

The first connection electrode may be connected to the first semiconductor layer through a contact hole in the first gate insulating layer, the second interlayer insulating layer, the third interlayer insulating layer, the second gate insulating layer, and the fourth interlayer insulating layer.

The first connection electrode may be connected to the auxiliary data line through a contact hole in the first interlayer insulating layer, the first gate insulating layer, the second interlayer insulating layer, the third interlayer insulating layer, the second gate insulating layer, and the fourth interlayer insulating layer.

An electrical signal, which is the same as an electrical signal transmitted to the data line, may be transmitted to the auxiliary data line.

The data line may extend in the first direction.

A width of some portions of the auxiliary data line may be different from a width of other portions of the auxiliary data line.

The auxiliary data line may be directly and physically connected to the first connection electrode, and the first connection electrode may be directly and physically connected to the data line.

The first conductive layer may further include a shielding layer, and the shielding layer may include a pattern having an island shape and a connection line extending from the pattern in the first direction.

The second connection electrode layer may further include a driving voltage line, and the driving voltage line may be electrically connected to the shielding layer.

The first connection electrode layer may further include a second connection electrode, and the driving voltage line may be connected to the second connection electrode through a contact hole in the planarization layer.

The second connection electrode may be connected to the first semiconductor layer through a contact hole in the first gate insulating layer, the second interlayer insulating layer, the third interlayer insulating layer, the second gate insulating layer, and the fourth interlayer insulating layer.

The second connection electrode may be connected to the shielding layer through a contact hole in the first interlayer insulating layer, the first gate insulating layer, the second interlayer insulating layer, the third interlayer insulating layer, the second gate insulating layer, and the fourth interlayer insulating layer.

An electrical signal, which is the same as an electrical signal transmitted to the driving voltage line, may be transmitted to the shielding layer.

The shielding layer may include the same material as the auxiliary data line.

The shielding layer may have the same layer structure as the auxiliary data line.

An electrical signal, which is different from an electrical signal transmitted to the auxiliary data line, may be transmitted to the shielding layer.

The first interlayer insulating layer, the first gate insulating layer, the second interlayer insulating layer, the third interlayer insulating layer, the second gate insulating layer, and the fourth interlayer insulating layer may include a first groove extending in the first direction, and the planarization layer may be configured to fill the first groove.

The first interlayer insulating layer, the first gate insulating layer, the second interlayer insulating layer, the third interlayer insulating layer, the second gate insulating layer, and the fourth interlayer insulating layer may further include a second groove extending in a second direction crossing the first direction, and the planarization layer may be configured to fill the second groove.

It is to be understood that both the foregoing general description and the following detailed description are illustrative and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate illustrative embodiments of the invention, and together with the description serve to explain the inventive concepts.

DETAILED DESCRIPTION

Figure 1:
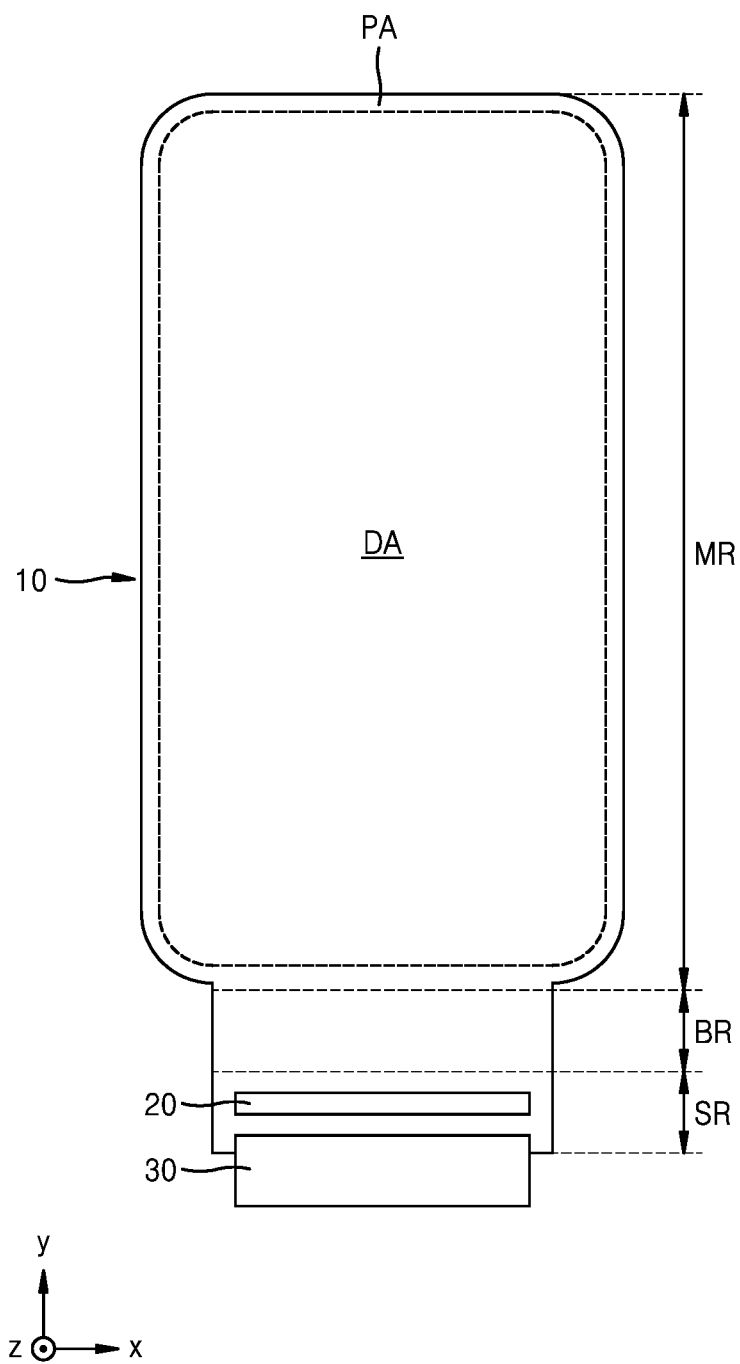
FIG. 1 is a schematic plan view of a portion of a display apparatus, according to an embodiment.

In the following description, for the purposes of explanation, numerous specific details are set forth in order to provide a thorough understanding of various embodiments or implementations of the invention. As used herein "embodiments" and "implementations" are interchangeable words that are non-limiting examples of devices or methods employing one or more of the inventive concepts disclosed herein. It is apparent, however, that various embodiments may be practiced without these specific details or with one or more equivalent arrangements. In other instances, well-known structures and devices are shown in block diagram form in order to avoid unnecessarily obscuring various embodiments. Further, various embodiments may be different, but do not have to be exclusive. For example, specific shapes, configurations, and characteristics of an embodiment may be used or implemented in another embodiment without departing from the inventive concepts.

Unless otherwise specified, the illustrated embodiments are to be understood as providing illustrative features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various embodiments are described herein with reference to sectional and/or exploded illustrations that are schematic illustrations of idealized embodiments and/or intermediate structures. As such, variations from the shapes of the illustrations as a result, for example, of manufacturing techniques and/or tolerances, are to be expected. Thus, embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Figure 2:
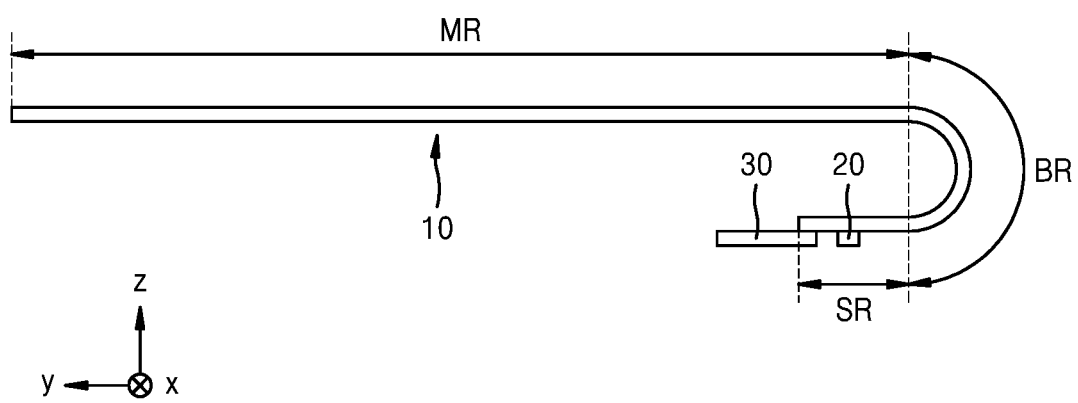
FIG. 2 is a schematic side view of the display apparatus of FIG. 1.

FIG. 1 is a schematic plan view of a portion of a display apparatus, according to an embodiment, and FIG. 2 is a schematic side view of the display apparatus of FIG. 1. A portion of the display apparatus according to the present embodiment is bent, as illustrated in FIG. 2, but FIG. 1 illustrates that the display apparatus is not bent for convenience.

As illustrated in FIGS. 1 and 2, the display apparatus includes a display panel 10. The display apparatus may be of any type when the display apparatus includes the display panel 10. For example, the display apparatus may be of various types, such as a smartphone, a tablet personal computer (PC), a laptop, a television (TV), and a billboard.

The display panel 10 includes a display area DA and a peripheral area PA on an outer side of the display area DA. The display area DA may be an area where an image is displayed and pixels are arranged. When viewed in a direction substantially perpendicular to the display panel 10, the display area DA may have various shapes, such as a circle, an oval, a polygon, and a certain-shaped figure. FIG. 1 illustrates that a shape of the display area DA is substantially a rectangle with round edges.

The peripheral area PA may be arranged on the outer side of the display area DA. A width of a portion of the peripheral area PA (in an x-axis direction) may be less than a width of the display area DA (in the x-axis direction). As described below, at least a portion of the peripheral area PA may be easily bent because of the above structure.

Because the display panel 10 includes a substrate 100 (see FIG. 13), it may be stated that the substrate 100 has the display area DA and the peripheral area PA described above. Hereinafter, the substrate 100 includes the display area DA and the peripheral area PA for convenience.

The display panel 10 may also have a main region MR, a bent region BR outside the main region MR, and a sub-region SR that is opposite to the main region MR with respect to the bent region BR. As illustrated in FIG. 2, the display panel 10 is bent in the bent region BR, and thus, when viewed in a z-axis direction, at least a portion of the sub-region SR may overlap the main region MR. However, the inventive concepts are not limited to a bent display apparatus and may be applied to a display apparatus that is not bent. As described below, the sub-region SR may be a non-display region. The display panel 10 is bent in the bent region BR, and thus, when the display apparatus is viewed in the z-axis direction, the non-display region may not be viewed, or an area of a visible portion may be reduced even if the non-display region is viewed.

A driving chip 20 may be arranged in the sub-region SR of the display panel 10. The driving chip 20 may include an integrated circuit for driving the display panel 10. Such an integrated circuit may be a data driving integrated circuit for generating data signals, but the inventive concepts are not limited thereto.

The driving chip 20 may be mounted in the sub-region SR of the display panel 10. Although the driving chip 20 is mounted on the same surface as a display surface of the display area DA, the driving chip 20 may be on a rear surface of the main region MR as the display panel 10 is bent in the bent region BR, as described above.

A printed circuit board 30, etc. may be attached to an end portion of the sub-region SR of the display panel 10. The printed circuit board 30, etc. may be electrically connected to the driving chip 20, etc. through a pad (not illustrated) on the substrate 100.

Hereinafter, an organic light-emitting display apparatus is an example of the display apparatus according to an embodiment of the invention, but the display apparatus is not limited thereto. As another embodiment, the display apparatus may be an inorganic light-emitting display apparatus (or an inorganic EL display apparatus), a quantum dot light-emitting display apparatus, or the like. For example, an emission layer of a display element included in the display apparatus may include an organic material or an inorganic material. Also, the display apparatus may include the emission layer and a quantum-dot layer arranged in a path of light emitted from the emission layer.

As described above, the display panel 10 includes the substrate 100. Various components included in the display panel 10 may be arranged above the substrate 100. The substrate 100 may include glass, metal, or polymer resin. As described above, when the display panel 10 is bent in the bent region BR, there is a need for the substrate 100 to be flexible or bendable. In this case, the substrate 100 may include polymer resin such as polyethersulfone, polyacrylate, polyetherimide, polyethylene naphthalate, polyethylene terephthalate, polyphenylene sulfide, polyarylate, polyimide, polycarbonate, or cellulose acetate propionate. Various modifications may be made to the substrate 100. For example, the substrate 100 may have a multilayered structure including two layers including the above polymer resin and a barrier layer that includes an inorganic material (e.g., silicon oxide, silicon nitride, silicon oxynitride, or the like) and is arranged between the layers.

In the display area DA, pixels are arranged. Each pixel indicates a sub-pixel and may include a display element, such as an organic light-emitting diode OLED. The pixel may emit, for example, red, green, blue, or white light.

The pixel may be electrically connected to outer circuits arranged in the peripheral area PA. In the peripheral area PA, a scan driving circuit, an emission control driving circuit, a terminal, a driving power supply line, an electrode power supply line, etc. may be arranged. The scan driving circuit may be configured to provide a scan signal to the pixel through a scan line. The emission control driving circuit may be configured to provide an emission control signal to the pixel through an emission control line. The terminal, which is arranged in the peripheral area PA of the substrate 100, may not be covered by an insulating layer and be exposed, thus being electrically connected to the printed circuit board 30. A terminal of the printed circuit board 30 may be electrically connected to a terminal of the display panel 10.

The printed circuit board 30 may transmit, to the display panel 10, a signal or power of a controller (not illustrated). Control signals generated by the controller may be respectively transmitted to driving circuits through the printed circuit board 30. Also, the controller may transmit a driving voltage ELVDD to the driving power supply line and provide a common voltage ELVSS to the electrode power supply line. The driving voltage ELVDD may be transmitted to each pixel through a driving voltage line 1730 (see FIG. 12) connected to the driving power supply line, and the common voltage ELVSS may be transmitted to an opposite electrode 230 (see FIG. 13) connected to the electrode power supply line. The electrode power supply line may have a loop shape of which one side is open and thus may partially surround the display area DA.

Figure 12:
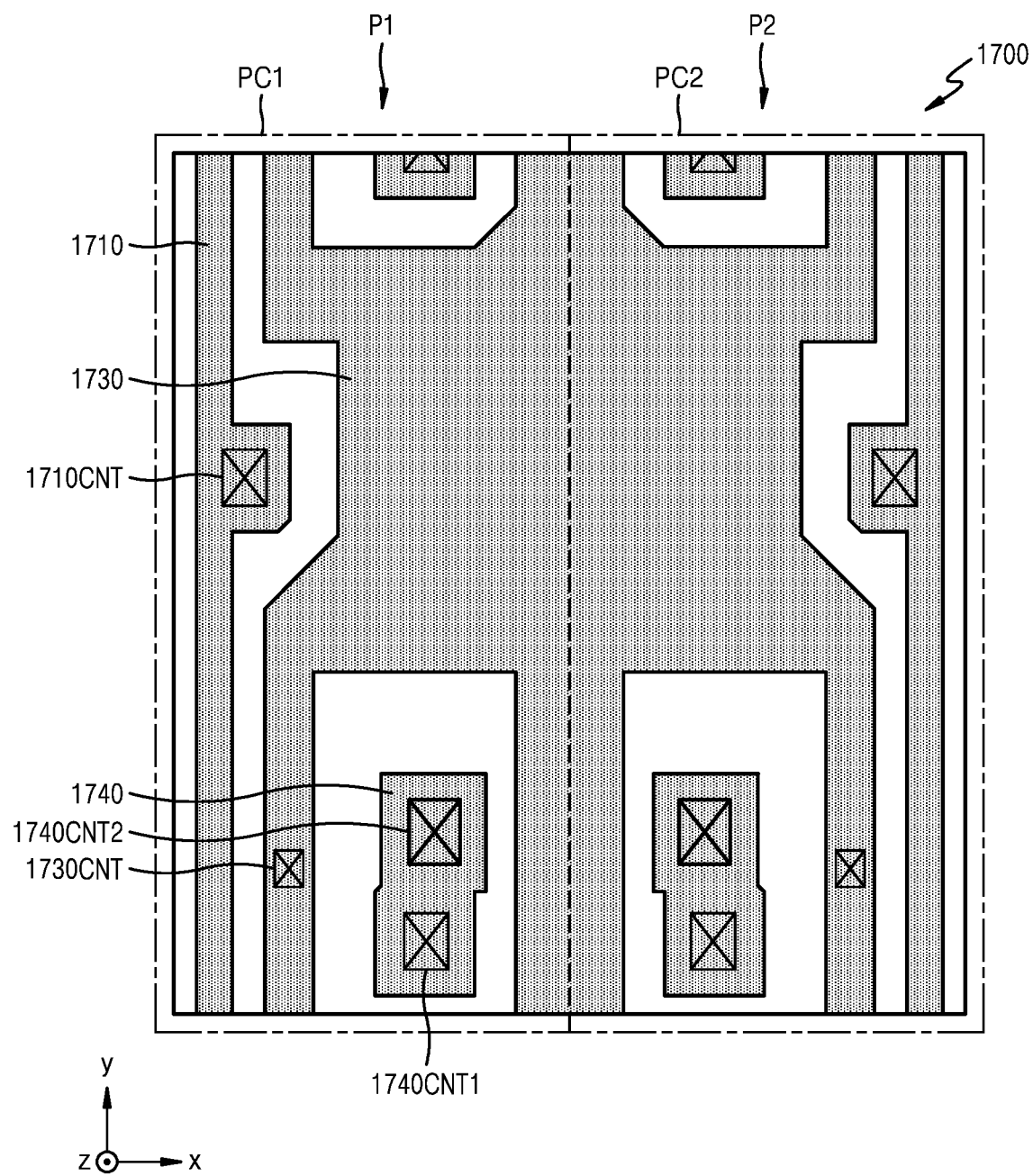

The controller may generate data signals, and the generated data signals may be transmitted to the pixels through the driving chip 20 and a data line 1710 (see FIG. 12).

For reference, the term "line" may denote a "wire," which is the same in embodiments below and modified examples thereof.

Figure 3:
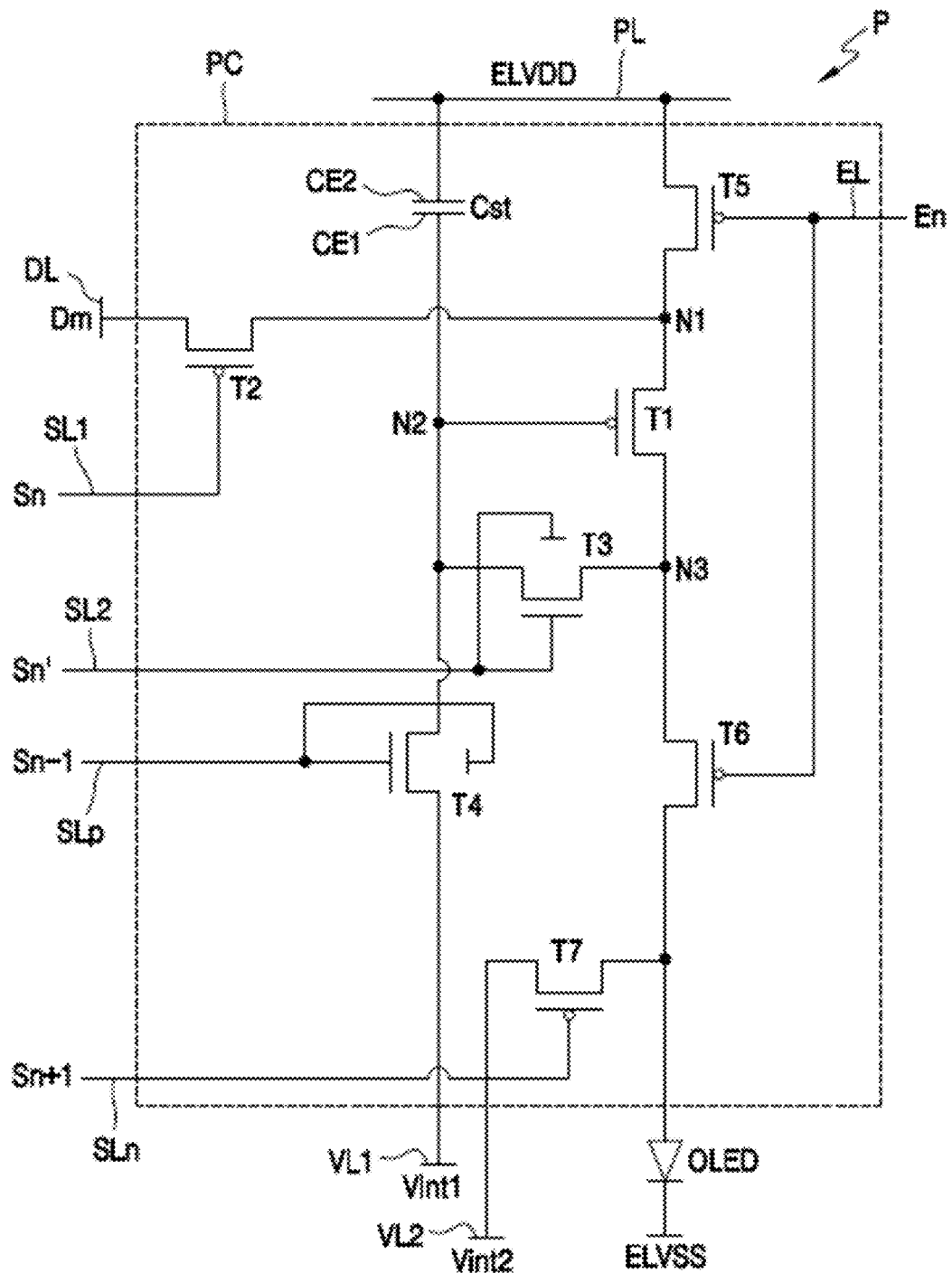
FIG. 3 is an equivalent circuit diagram of a pixel included in the display apparatus of FIG. 1.

FIG. 3 is an equivalent circuit diagram of a pixel P included in the display apparatus of FIG. 1. As illustrated in FIG. 3, the pixel P may include a pixel circuit PC and an organic light-emitting diode OLED electrically connected thereto.

As illustrated in FIG. 3, the pixel circuit PC may include a plurality of thin-film transistors T1 to T7 and a storage capacitor Cst. The thin-film transistors T1 to T7 and the storage capacitor Cst may be connected to signal lines SL1, SL2, SLp, SLn, EL, and DL, a first initialization voltage line VL1, a second initialization voltage line VL2, and a driving voltage line PL. At least one of the lines, for example, the driving voltage line PL, may be shared between neighboring pixels P.

The thin-film transistors T1 to T7 may include a driving transistor T1, a switching transistor T2, a compensation transistor T3, a first initialization transistor T4, a driving control transistor T5, an emission control transistor T6, and a second initialization transistor T7.

The organic light-emitting diode OLED may include a first electrode (e.g., a pixel electrode) and a second electrode (e.g., an opposite electrode), the first electrode of the organic light-emitting diode OLED may be connected to the driving transistor T1 via the emission control transistor T6 and receive a driving current, and the second electrode may receive the common electrode ELVSS. The organic light-emitting diode OLED may generate light having brightness corresponding to the driving current.

Some of the thin-film transistors T1 to T7 may each be an n-channel MOSFET (NMOS), and the others thereof may each be a p-channel MOSFET (PMOS). For example, the compensation transistor T3 and the first initialization transistor T4 from among the thin-film transistors T1 to T7 may each be an NMOS, and the others thereof may each be a PMOS. Alternatively, the compensation transistor T3, the first initialization transistor T4, and the second initialization transistor T7 from among the thin-film transistors T1 to T7 may each be an NMOS, and the others thereof may each be a PMOS. Alternatively, all of the thin-film transistors T1 to T7 may each be an NMOS or a PMOS. The thin-film transistors T1 to T7 may each include amorphous silicon or polysilicon. According to necessity, an NMOS thin-film transistor may include an oxide semiconductor. Hereinafter, for convenience, the compensation transistor T3 and the first initialization transistor T4 may each be an NMOS including an oxide semiconductor, and the others of the thin-film transistors T1 to T7 may each be a PMOS.

The signal lines may include: a first scan line SL1 configured to transmit a first scan signal Sn; a second scan line SL2 configured to transmit a second scan signal Sn'; a previous scan line SLp configured to transmit a previous scan signal Sn−1 to the first initialization transistor T4; a next scan line SLn configured to transmit a next scan signal Sn+1 to the second initialization transistor T7; an emission control line EL configured to transmit an emission control signal En to the driving control transistor T5 and the emission control transistor T6; and a data line DL crossing the first scan line SL1 and configured to transmit a data signal Dm.

The driving voltage line PL may be configured to transmit the driving voltage ELVDD to the driving transistor T1, the first initialization voltage line VL1 may be configured to transmit a first initialization voltage Vint1 for initializing the driving transistor T1, and the second initialization voltage line VL2 may be configured to transmit a second initialization voltage Vint2 for initializing the first electrode of the organic light-emitting diode OLED.

A driving gate electrode of the driving transistor T1 may be connected to the storage capacitor Cst through a second node N2, any one of a source area and a drain area of the driving transistor T1 may be connected to the driving voltage line PL through a first node N1 via the driving control transistor T5, and the other of the source area and the drain area of the driving transistor T1 may be electrically connected to the first electrode (the pixel electrode) of the organic light-emitting diode OLED through a third node N3 via the emission control transistor T6. The driving transistor T1 may be configured to receive the data signal Dm according to a switching operation of the switching transistor T2 and provide the driving current to the organic light-emitting diode OLED. That is, the driving transistor T1 may control the amount of a current flowing to the organic light-emitting diode OLED from the first node N1 that is electrically connected to the driving voltage line PL, according to a voltage applied to the second node N2 and changing according to the data signal Dm.

A switching gate electrode of the switching transistor T2 may be connected to the first scan line SL1 configured to transmit the first scan signal Sn, any one of a source area and a drain area of the switching transistor T2 may be connected to the data line DL, and the other of the source area and the drain area of the switching transistor T2 may be connected to the driving transistor T1 through the first node N1 and connected to the driving voltage line PL via the driving control transistor T5. The switching transistor T2 may be configured to transmit the data signal Dm from the data line DL to the first node N1, according to a voltage applied to the first scan line SL1. That is, the switching transistor T2 may be turned on in response to the first scan signal Sn transmitted through the first scan line SL1 and may perform a switching operation in which the data signal Dm transmitted through the data line DL is transmitted to the driving transistor T1 through the first node N1.

A compensation gate electrode of the compensation transistor T3 may be connected to the second scan line SL2. Any one of a source area and a drain area of the compensation transistor T3 may be connected to the first electrode of the organic light-emitting diode OLED through the third node N3 via the emission control transistor T6. The other of the source area and the drain area of the compensation transistor T3 may be connected to a first capacitor electrode CE1 of the storage capacitor Cst and the driving gate electrode of the driving transistor T1 through the second node N2. The compensation transistor T3 may be turned on in response to the second scan signal Sn' transmitted through the second scan line SL2 and may diode-connect the driving transistor T1.

A first initialization gate electrode of the first initialization transistor T4 may be connected to the previous scan line SLp. Any one of a source area and a drain area of the first initialization transistor T4 may be connected to the first initialization voltage line VL1. The other of the source area and the drain area of the first initialization transistor T4 may be connected to the first capacitor electrode CE1 of the storage capacitor Cst and the driving gate electrode of the driving transistor T1 through the second node N2. The first initialization transistor T4 may apply the first initialization voltage Vint1 from the first initialization voltage line VL1 to the second node N2, according to a voltage applied to the previous scan line SLp. That is, the first initialization transistor T4 may be turned on in response to the previous scan signal Sn−1 transmitted through the previous scan line SLp and may perform an initialization operation in which the first initialization voltage Vint1 is transmitted to the driving gate electrode of the driving transistor T1 and a voltage of the driving gate electrode of the driving transistor T1 is initialized.

A driving control gate electrode of the driving control transistor T5 may be connected to the emission control line EL, any one of a source area and a drain area of the driving control transistor T5 may be connected to the driving voltage line PL, and the other of the source area and the drain area of the driving control transistor T5 may be connected to the driving transistor T1 and the switching transistor T2 through the first node N1.

An emission control gate electrode of the emission control transistor T6 may be connected to the emission control line EL, any one of a source area and a drain area of the emission control transistor T6 may be connected to the driving transistor T1 and the compensation transistor T3 through the third node N3, and the other of the source area and the drain area of the emission control transistor T6 may be electrically connected to the first electrode (the pixel electrode) of the organic light-emitting diode OLED.

The driving control transistor T5 and the emission control transistor T6 may be simultaneously turned on in response to the emission control signal En transmitted through the emission control line EL, and the driving voltage ELVDD may be transmitted to the organic light-emitting diode OLED. Thus, the driving current may flow in the organic light-emitting diode OLED.

A second initialization gate electrode of the second initialization transistor T7 may be connected to the next scan line SLn, any one of a source area and a drain area of the second initialization transistor T7 may be connected to the first electrode (the pixel electrode) of the organic light-emitting diode OLED, and the other of the source area and the drain area of the second initialization transistor T7 may be connected to the second initialization voltage line VL2 and thus may receive the second initialization voltage Vint2. The second initialization transistor T7 may be turned on in response to the next scan signal Sn+1 transmitted through the next scan line SLn and configured to initialize the first electrode (the pixel electrode) of the organic light-emitting diode OLED. The next scan line SLn may be identical to the first scan line SL1. In this case, such scan lines are configured to transmit the same electrical signal with a time difference and may function as the next scan line SLn and the first scan line SL1. That is, the next scan line SLn may be a first scan line of a pixel electrically connected to the data line DL as a pixel that is adjacent to the pixel P of FIG. 3.

The second initialization transistor T7 may be connected to the next scan line SLn, as illustrated in FIG. 3. However, the inventive concepts are not limited thereto. The second initialization transistor T7 may be connected to the emission control line EL and driven according to the emission control signal En.

The storage capacitor Cst may include the first capacitor electrode CE1 and a second capacitor electrode CE2. The first capacitor electrode CE1 of the storage capacitor Cst is connected to the driving gate electrode of the driving transistor T1 through the second node N2, and the second capacitor electrode CE2 of the storage capacitor Cst is connected to the driving voltage line PL. The storage capacitor Cst may be configured to store charges corresponding to a difference between a driving gate electrode voltage of the driving transistor T1 and the driving voltage ELVDD.

A detailed operation of each pixel P is as follows.

During an initialization period, when the previous scan signal Sn−1 is provided through the previous scan line SLp, the first initialization transistor T4 is turned on in response to the previous scan signal Sn−1, and the driving transistor T1 is initialized because of the first initialization voltage Vint1 from the first initialization voltage line VL1.

During a data programming period, when the first scan signal Sn and the second scan signal Sn' are provided through the first scan line SL1 and the second scan line SL2, the switching transistor T2 and the compensation transistor T3 are turned on in response to the first scan signal Sn and the second scan signal Sn'. In this case, the driving transistor T1 is diode-connected by the compensation transistor T3 that is turned on, and is biased in a forward direction. Then, a compensation voltage Dm+Vth (where, Vth has a negative value), which is obtained by subtracting a threshold voltage Vth of the driving transistor T1 from the data signal Dm provided through the data line DL, is applied to the driving gate electrode of the driving transistor T1. The driving voltage ELVDD and the compensation voltage Dm+Vth are applied to both ends of the storage capacitor Cst, and charges corresponding to a voltage difference between the ends are stored in the storage capacitor Cst.

During an emission period, the driving control transistor T5 and the emission control transistor T6 are turned on in response to the emission control signal En provided through the emission control line EL. A driving current according to a difference between the voltage of the driving gate electrode of the driving transistor T1 and the driving voltage ELVDD is generated, and the driving current is provided to the organic light-emitting diode OLED through the emission control transistor T6.

As described above, some of the thin-film transistors T1 to T7 may include an oxide semiconductor. For example, the compensation transistor T3 and the first initialization transistor T4 may each include an oxide semiconductor.

Because polysilicon has high reliability, the compensation transistor T3 and the first initialization transistor T4 may control an accurately intended current to accurately flow. Therefore, in the case of the driving transistor T1 that directly affects the brightness of the display apparatus, the driving transistor T1 is designed to include a semiconductor layer including highly reliable polysilicon, and thus, a high-resolution display apparatus may be realized. Because an oxide semiconductor has high carrier mobility and a low leakage current, a voltage does not greatly drop even though an operation time is long. That is, in the case of the oxide semiconductor, a color change in an image according to the voltage drop is not great even in a low frequency, and thus, the oxide semiconductor may be driven in a low frequency. Therefore, a display apparatus, in which a leakage current is prevented from occurring and power consumption is reduced, may be realized by making the compensation transistor T3 and the first initialization transistor T4 include oxide semiconductors.

Such an oxide semiconductor is sensitive to light, and thus, the current amount, etc., may change according to external light. Therefore, a metal layer may be arranged under the oxide semiconductor to absorb or reflect the external light. Accordingly, as illustrated in FIG. 3, a gate electrode of each of the compensation transistor T3 and the first initialization transistor T4 including the oxide semiconductors may be arranged on and under an oxide semiconductor layer. That is, when viewed in the z-axis direction, a metal layer arranged under the oxide semiconductor may overlap the oxide semiconductor.

Figure 4:
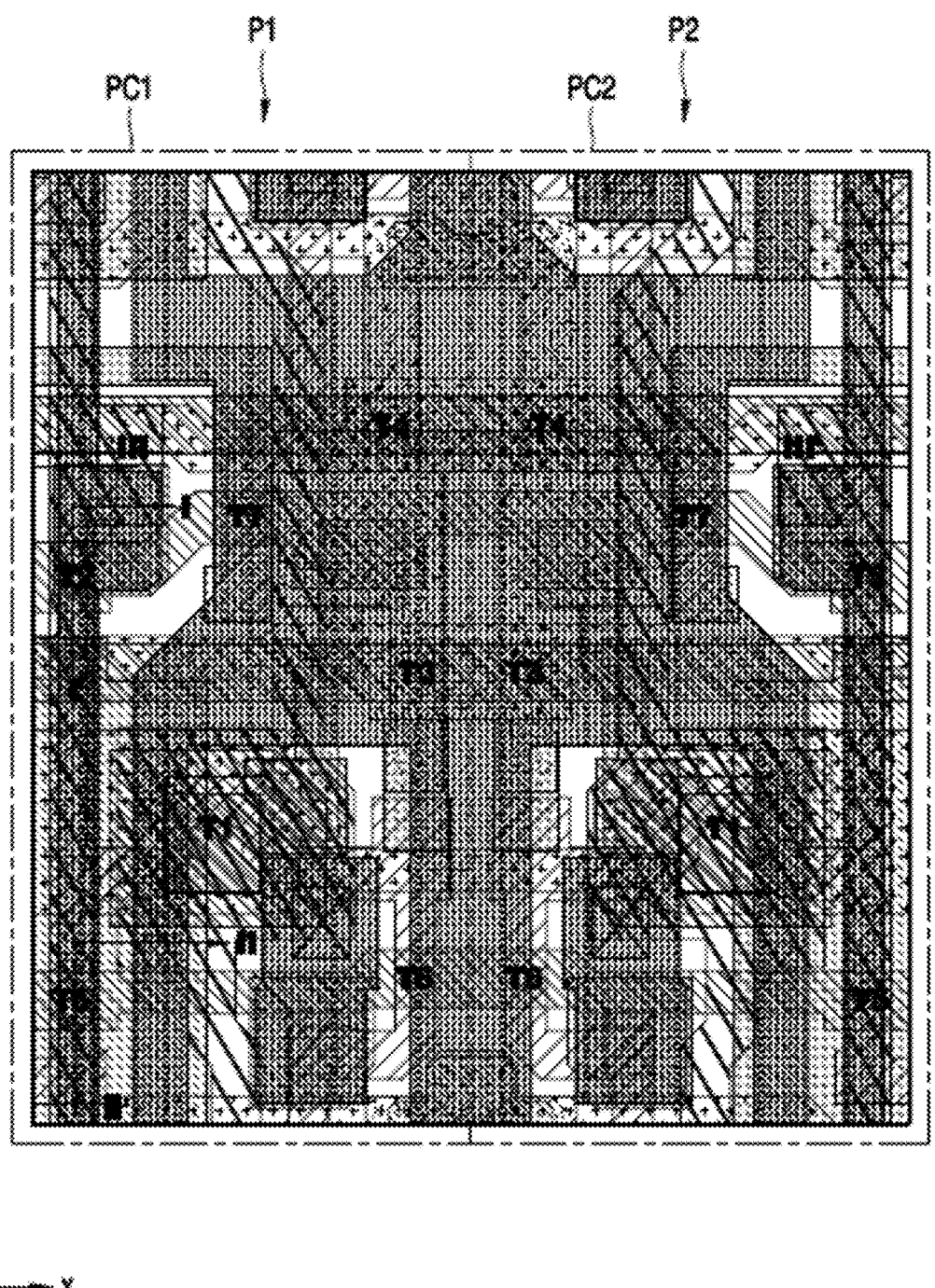
FIG. 4 is a schematic layout illustrating locations of transistors and a capacitor in pixels included in the display apparatus of FIG. 1.
Figure 13:
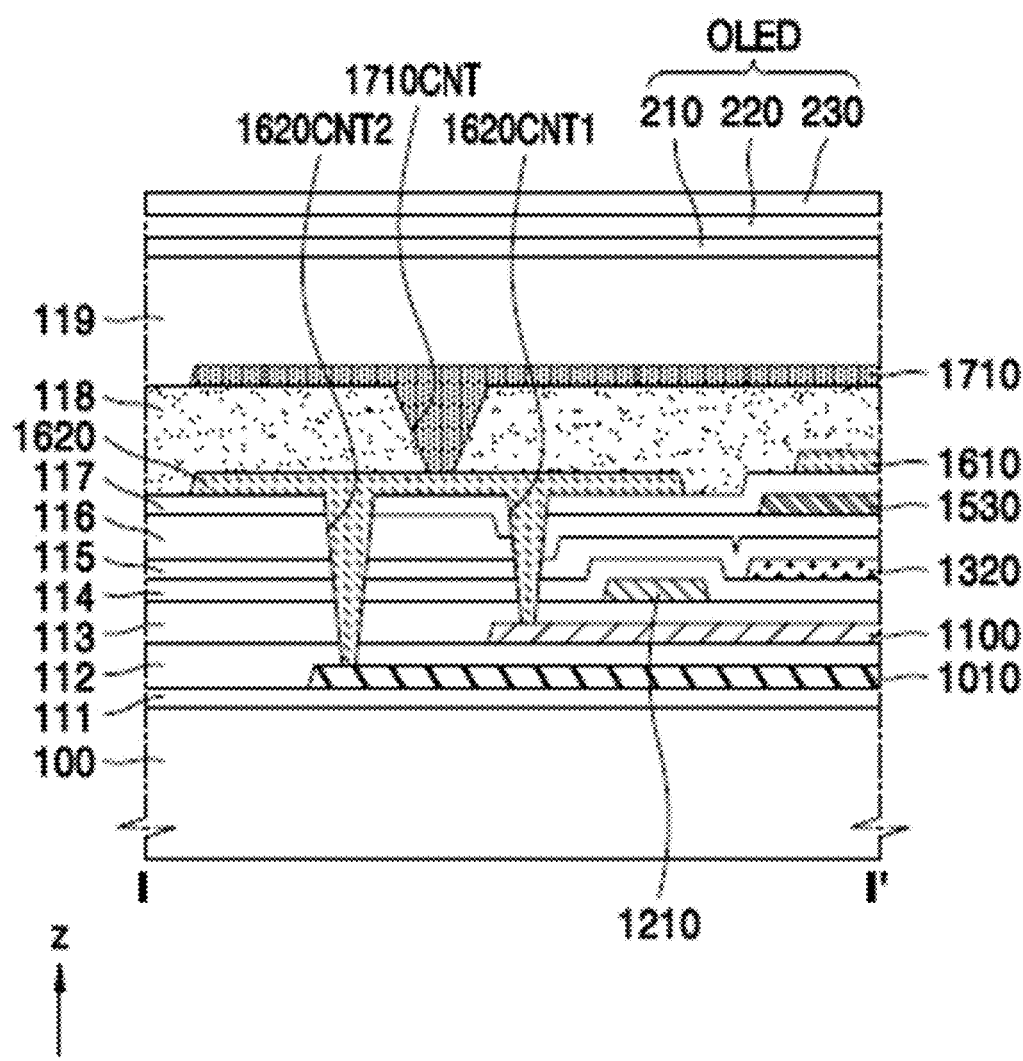
FIG. 13 is a schematic cross-sectional view of the display apparatus of FIG. 4, taken along line I-I' of FIG. 4.
Figure 14:
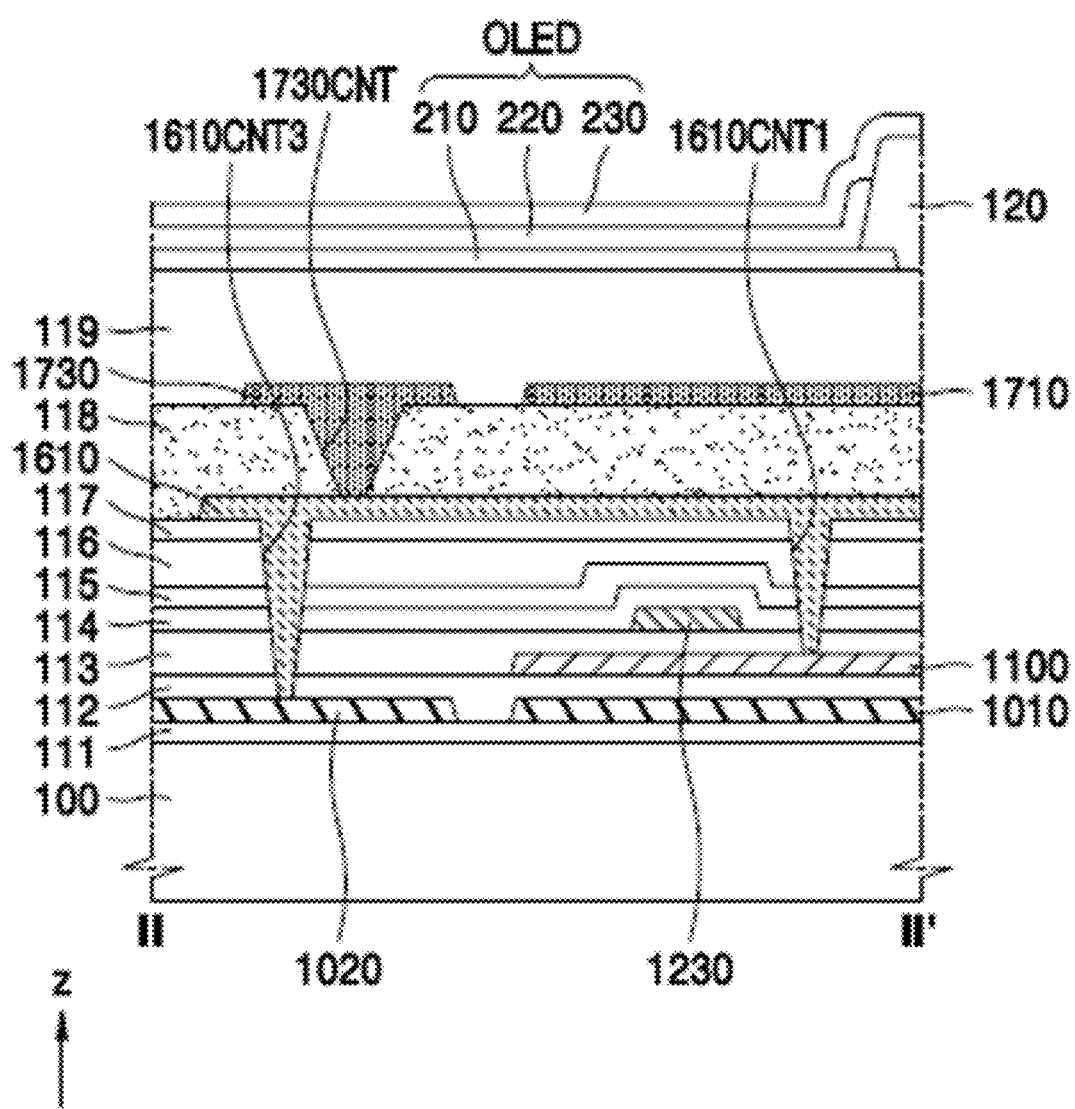
FIG. 14 is a schematic cross-sectional view of the display apparatus of FIG. 4, taken along line II-II' of FIG. 4.
Figure 15:
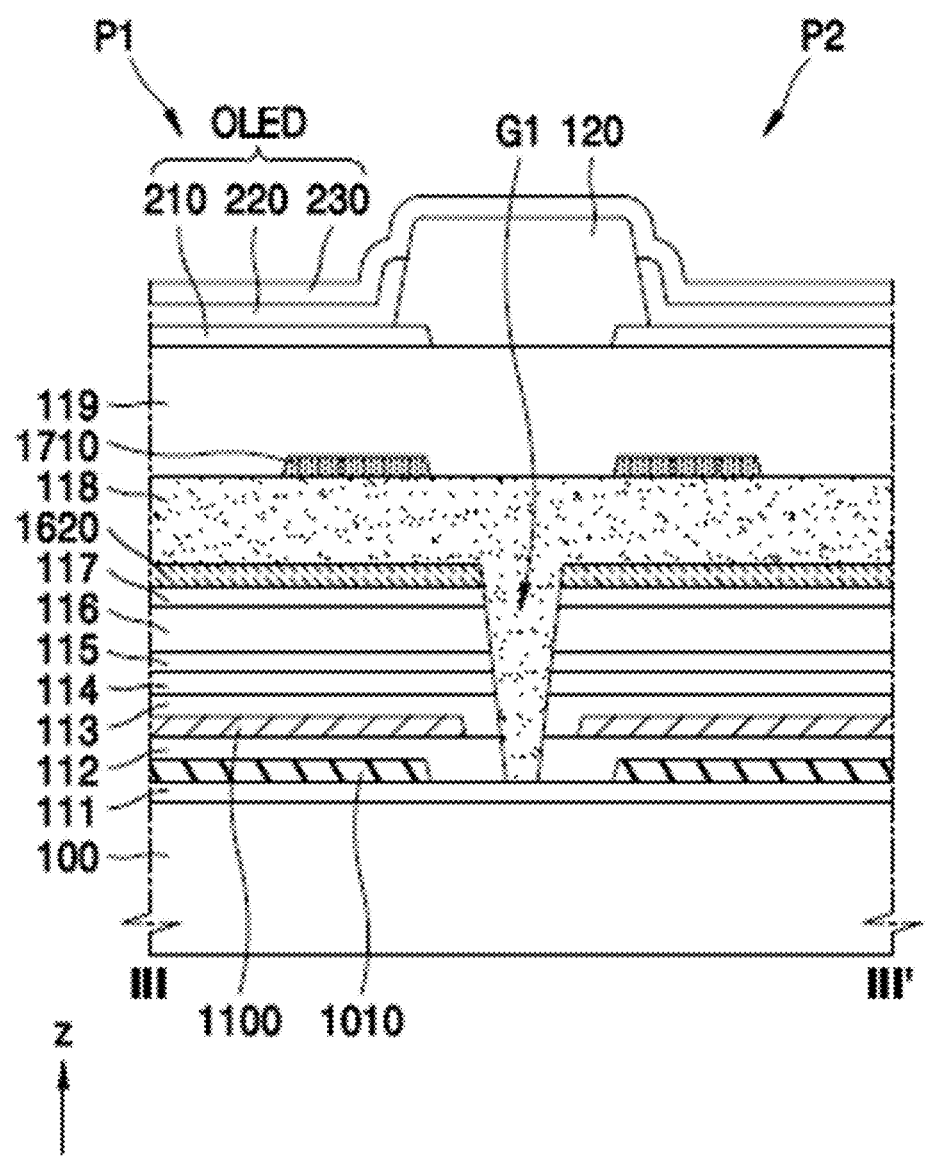
FIG. 15 is a schematic cross-sectional view of the display apparatus of FIG. 4, taken along line III-III' of FIG. 4.
Figure 16:
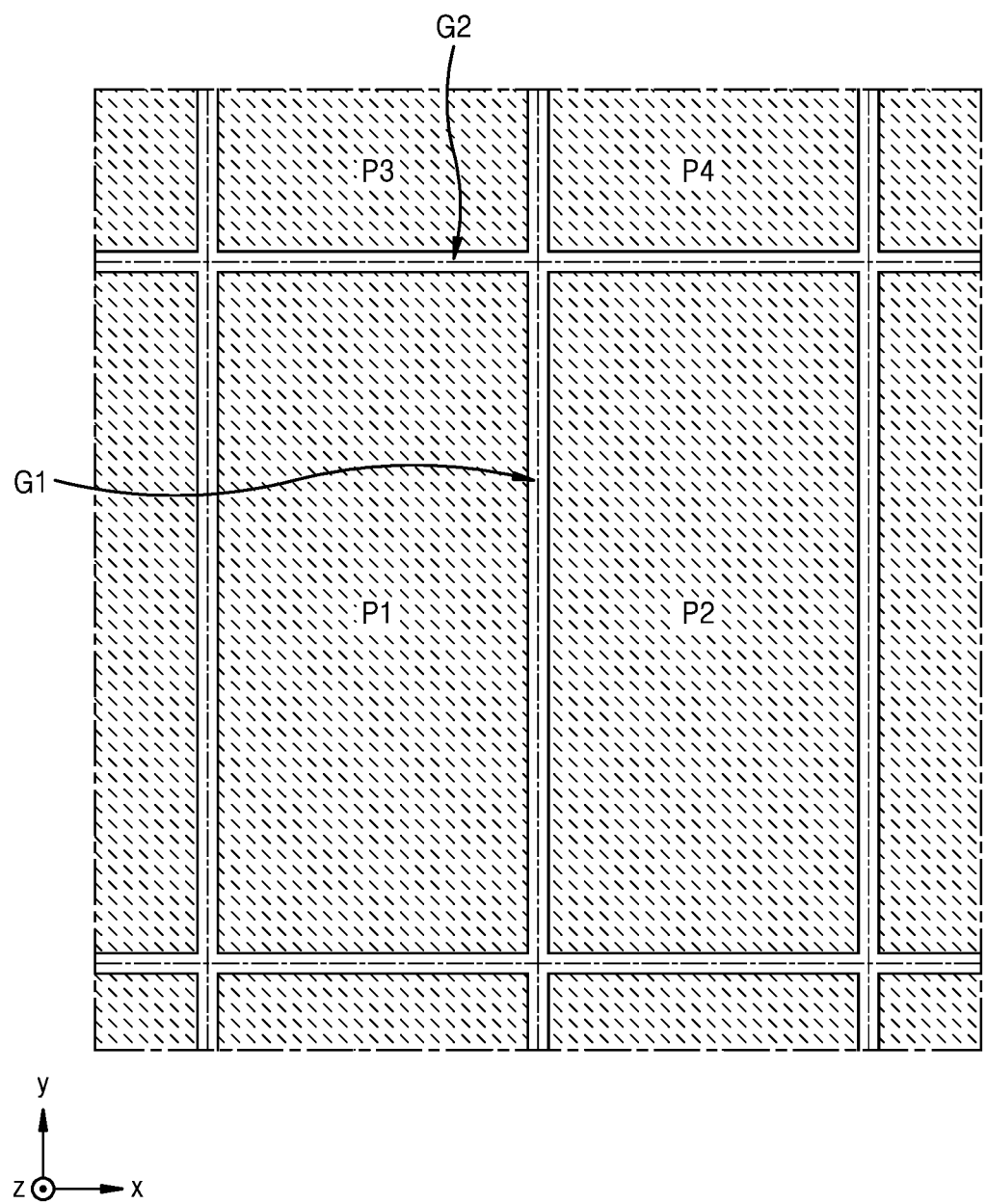
FIG. 16 is a schematic plan view of a first groove and a second groove in pixels included in a display apparatus, according to an embodiment.

FIG. 4 is a schematic layout illustrating locations of the thin-film transistors T1 to T7 and the storage capacitor Cst in pixels included in the display apparatus of FIG. 1, and FIGS. 5 to 12 are schematic layouts illustrating, by layers, components such as the thin-film transistors T1 to T7 and the storage capacitor Cst of the display apparatus of FIG. 4. FIG. 13 is a schematic cross-sectional view of the display apparatus of FIG. 4, taken along line I-I' of FIG. 4, and FIG. 14 is a schematic cross-sectional view of the display apparatus of FIG. 4, taken along line of FIG. 4. FIG. 15 is a schematic cross-sectional view of the display apparatus of FIG. 4, taken along line of FIG. 4, and FIG. 16 is a schematic plan view of a first groove G1 and a second groove G2 in pixels included in a display apparatus, according to an embodiment.

As illustrated in the drawings, the display apparatus may include a first pixel P1 and a second pixel P2 that are adjacent to each other. As illustrated in FIG. 4, etc., the first pixel P1 may be symmetrical to the second pixel P2 with respect to a virtual line. Unlike the illustrations, the first pixel P1 and the second pixel P2 may have the same structure other than a symmetrical structure. The first pixel P1 may include a first pixel circuit PC1, and the second pixel P2 may include a second pixel circuit PC2. Hereinafter, for convenience of explanation, some conductive patterns may be described by referring to the first pixel circuit PC1, but such conductive patterns may be symmetrically arranged in the second pixel circuit PC2.

A buffer layer 111 (see FIG. 13) including silicon oxide, silicon nitride, or silicon oxynitride may be arranged on the substrate 100. The buffer layer 111 may increase the smoothness of an upper surface of the substrate 100 and prevent metal atoms or impurities from diffusing from the substrate 100 into a first semiconductor layer 1100 (see FIG. 6) that is disposed above the buffer layer 111. The buffer layer 111 may be a layer or layers including silicon oxide, silicon nitride, or silicon oxynitride.

Figure 5:
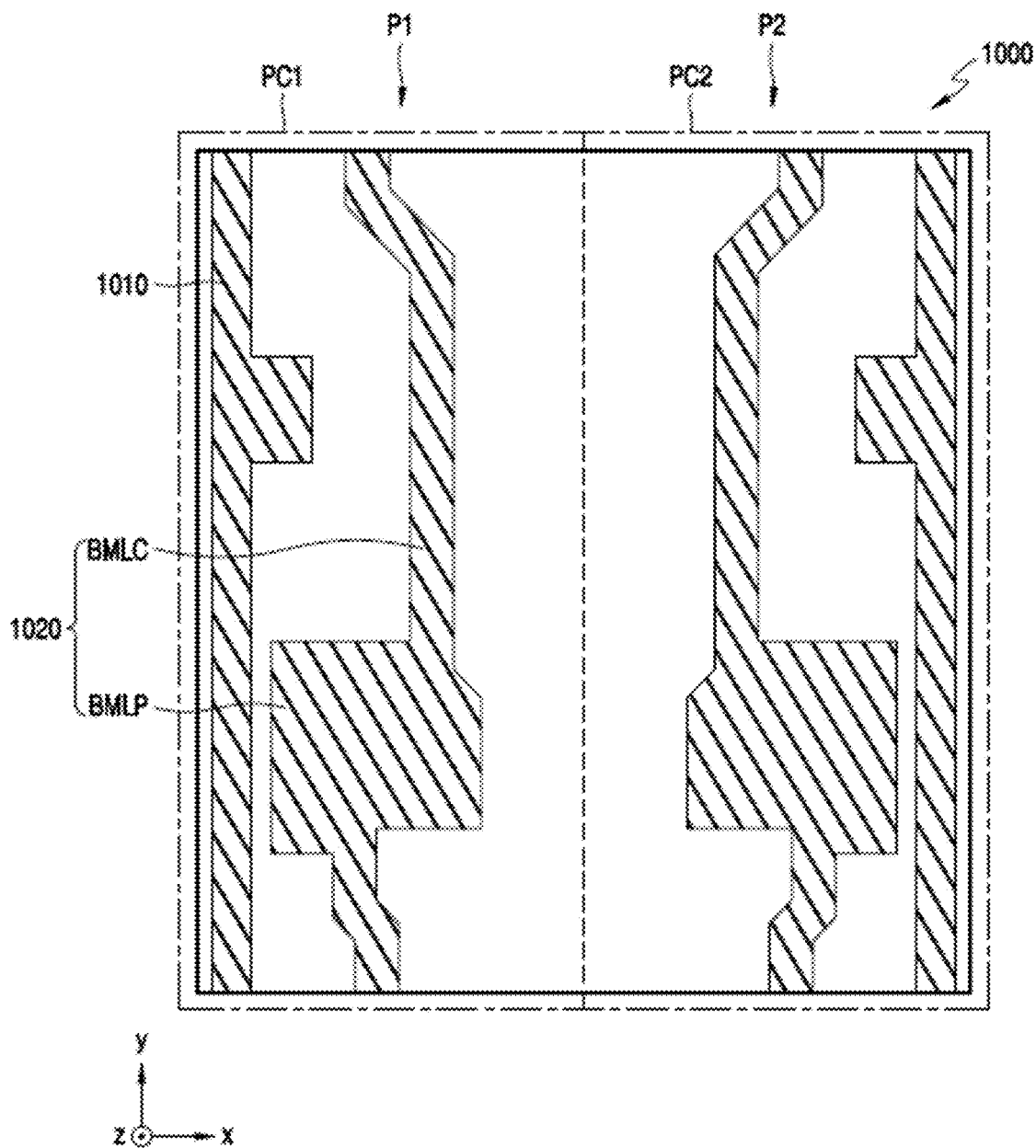
FIGS. 5, 6, 7, 8, 9, 10, 11, and 12 are schematic layouts illustrating, by layers, components such as transistors and a capacitor of the display apparatus of FIG. 4.

A first conductive layer 1000 illustrated in FIG. 5 may be arranged on the buffer layer 111. The first conductive layer 1000 may include an auxiliary data line 1010 extending in a first direction. Because the auxiliary data line 1010 may be electrically connected to the data line 1710 (see FIG. 12), the same electrical signal as an electrical signal transmitted to the data line 1710 may be transmitted to the auxiliary data line 1010. That is, the data signal Dm transmitted to the data line 1710 may be applied to the auxiliary data line 1010.

The first direction, in which the auxiliary data line 1010 extends, may be the same as a direction in which the data line 1710 extends. For example, the first direction may be a y-axis direction, but is not limited thereto. A width of some portions of the auxiliary data line 1010 may be different from a width of the other portions of the auxiliary data line 1010. For example, the width of the portions of the auxiliary data line 1010 may be greater than that of the other portions of the auxiliary data line 1010, and in the portions having the great width, the auxiliary data line 1010 may be electrically connected to the data line 1710.

Also, the first conductive layer 1000 may further include a shielding layer 1020. The shielding layer 1020 may include patterns BMLP having an island shape and connection lines BMLC extending from the patterns BMLP in the first direction. The pattern BMLP may have a shape corresponding to the driving transistor T1 and may function as a lower protective metal that protects portions of the first semiconductor layer 1100 that overlap the pattern BMLP. The connection line BMLC may extend in the same direction as the direction in which the auxiliary data line 1010 extends. The pattern BMLP may be integrally formed with the connection line BMLC, and as the patterns BMLP included in each pixel circuit are connected to each other by the connection line BMLC, the shielding layer 1020 may be integrated with pixels in the same column.

Because the shielding layer 1020 may be electrically connected to the driving voltage line 1730 (see FIG. 12), the same electrical signal as an electrical signal, which is transmitted to the driving voltage line 1730, may be transmitted to the shielding layer 1020. That is, the driving voltage EVLDD transmitted to the driving voltage line 1730 may also be transmitted to the shielding layer 1020. Therefore, an electrical signal, which is different from the electrical signal transmitted to the auxiliary data line 1010, may be transmitted to the shielding layer 1020.

The first conductive layer 1000 may include metal, an alloy, conductive metal oxide, a transparent conductive material, or the like. For example, the first conductive layer 1000 may include silver (Ag), an alloy including Ag, molybdenum (Mo), an alloy including Mo, aluminum (Al), an alloy including Al, aluminum nitride (AlN), tungsten (W), tungsten nitride (WN), copper (Cu), nickel (Ni), chromium (Cr), chromium nitride (CrN), titanium (Ti), tantalum (Ta), platinum (Pt), scandium (Sc), indium tin oxide (ITO), indium zinc oxide (IZO), or the like. The first conductive layer 1000 may have a multilayered structure, for example, a two-layer structure of Mo/Al or a three-layer structure of Mo/Al/Mo.

Because the shielding layer 1020 may be formed through the same process as the auxiliary data line 1010, the shielding layer 1020 may include the same material as the auxiliary data line 1010. Also, the shielding layer 1020 may have the same layer structure as the auxiliary data line 1010. For example, when the shielding layer 1020 has a two-layer structure, the auxiliary data line 1010 may also have the two-layer structure including the same material.

A first interlayer insulating layer 112 (see FIG. 13) may cover the first conductive layer 1000 and may be arranged on the buffer layer 111. The first interlayer insulating layer 112 may include an insulating material. For example, the first interlayer insulating layer 112 may include silicon oxide, silicon nitride, silicon oxynitride, or aluminum oxide.

Figure 6:
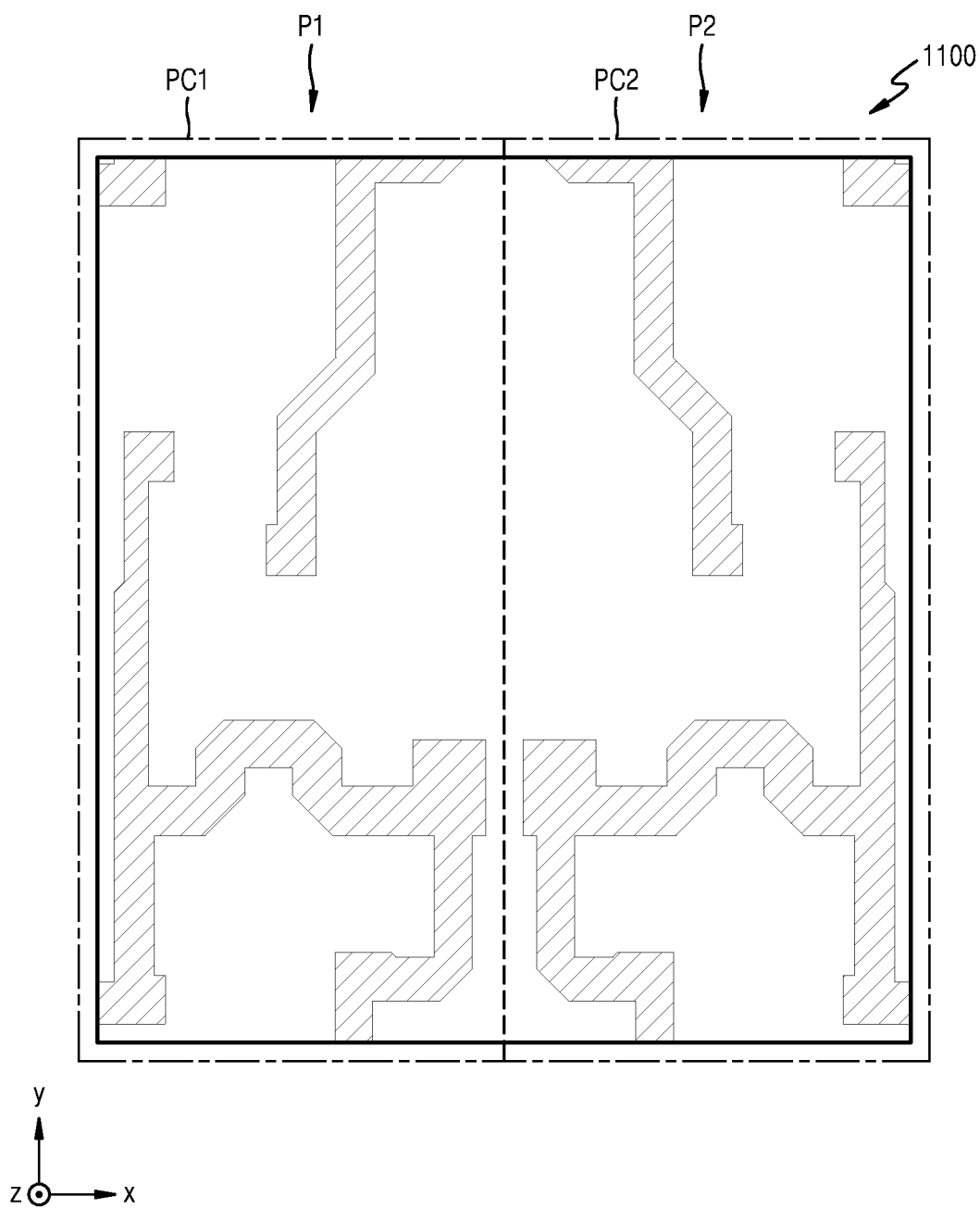

The first semiconductor layer 1100 illustrated in FIG. 6 may be arranged on the first interlayer insulating layer 112. The first semiconductor layer 1100 may include a silicon semiconductor. For example, the first semiconductor layer 1100 may include amorphous silicon or polysilicon. In detail, the first semiconductor layer 1100 may include polysilicon crystallized at a low temperature. According to necessity, ions may be injected into at least some portions of the first semiconductor layer 1100.

As described above, the driving transistor T1, the switching transistor T2, the driving control transistor T5, the emission control transistor T6, and the second initialization transistor T7 may each be a PMOS, and in this case, such thin-film transistors may be located according to the first semiconductor layer 1100 illustrated in FIG. 6.

A first gate insulating layer 113 (see FIG. 13) may cover the first semiconductor layer 1100 and may be arranged above the buffer layer 111. The first gate insulating layer 113 may include an insulating material. For example, the first gate insulating layer 113 may include an inorganic insulating layer, such as silicon oxide, silicon nitride, silicon oxynitride, or aluminum oxide.

Figure 7:
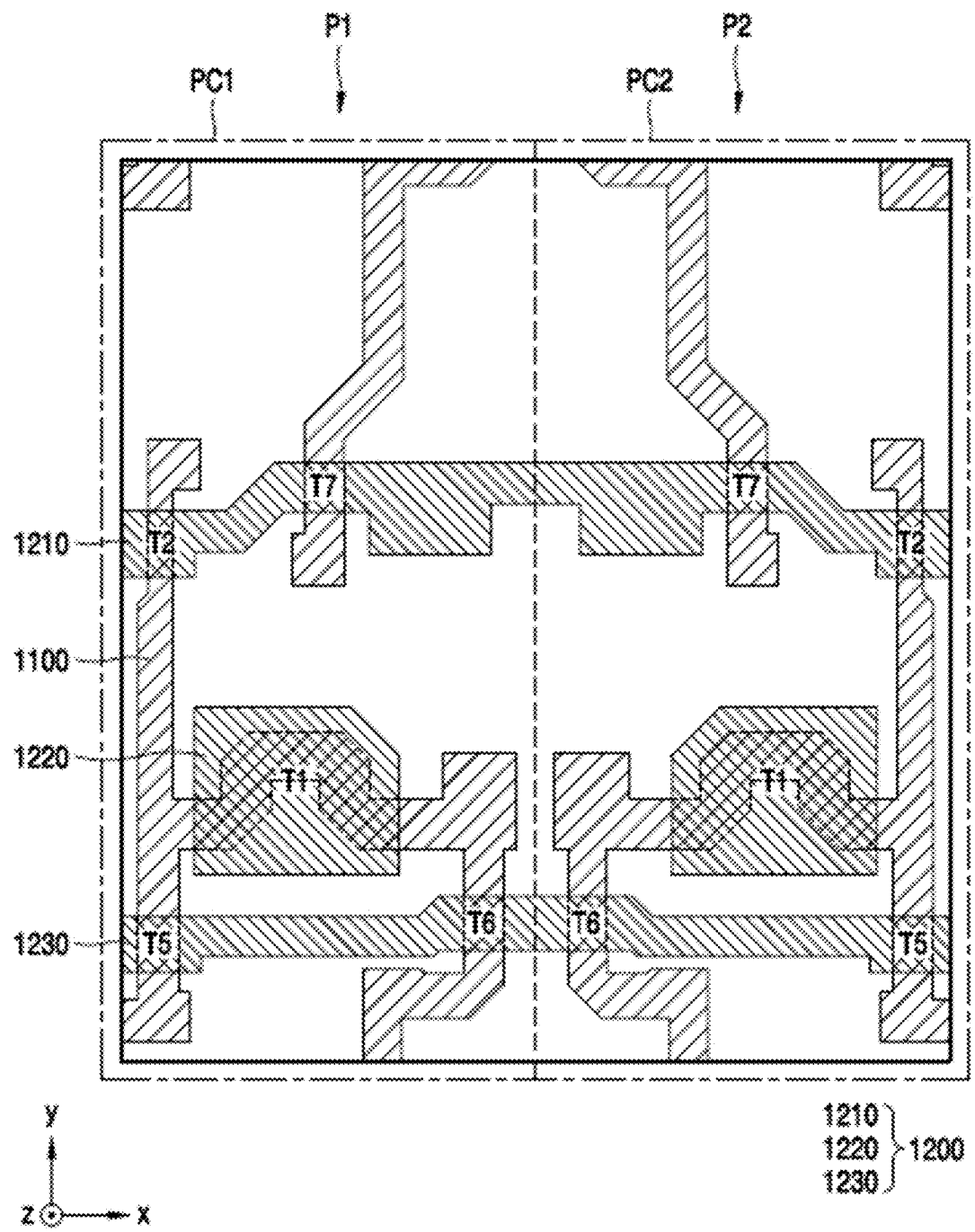
Figure 8:
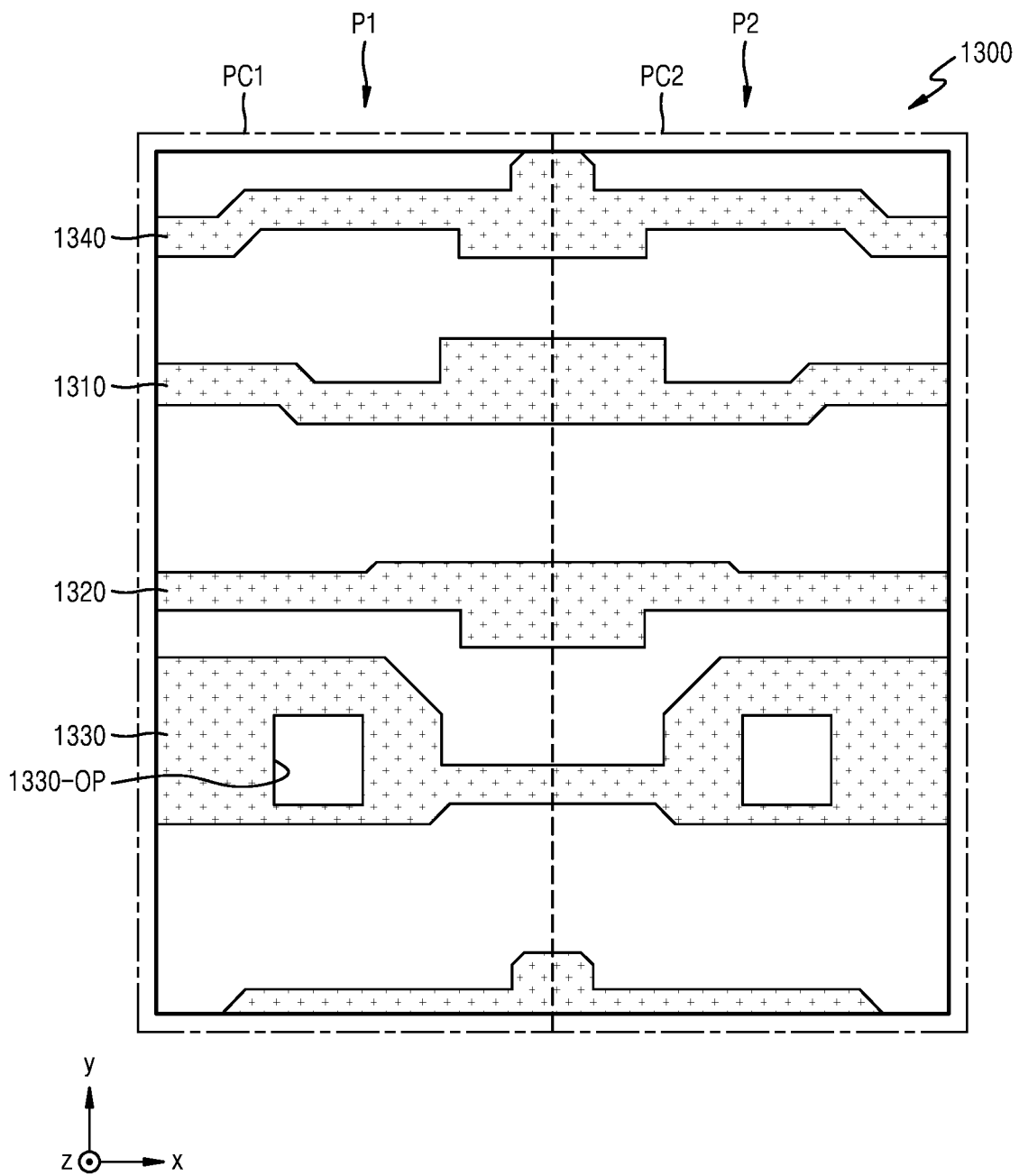

A first gate layer 1200 illustrated in FIG. 7 may be on the first gate insulating layer 113. For convenience, FIG. 7 illustrates the first gate layer 1200 and the first semiconductor layer 1100 together. The first gate layer 1200 may include a first gate line 1210, a first gate electrode 1220, and a second gate line 1230.

The first gate line 1210 may extend in the x-axis direction. The first gate line 1210 may be the first scan line SL1 or the next scan line SLn of FIG. 3. That is, in the first pixel P1 of FIG. 7, the first gate line 1210 may correspond to the first scan line SL1 of FIG. 3, and in a pixel that is adjacent to the first pixel P1 in the +y direction, the first gate line 1210 may correspond to the next scan line SLn of FIG. 3. Accordingly, the first scan signal Sn and the next scan signal Sn+1 may be transmitted to the pixels through the first gate line 1210. Portions of the first gate line 1210, which overlap the first semiconductor layer 1100, may be the switching gate electrode of the switching transistor T2 and the second initialization gate electrode of the second initialization transistor T7.

The first gate electrode 1220 may have an island shape. The first gate electrode 1220 may be the driving gate electrode of the driving transistor T1. For reference, a portion of the first semiconductor layer 1100, which overlaps the first gate electrode 1220, and a peripheral portion thereof may be referred to as a driving semiconductor layer.

The second gate line 1230 may extend in the x-axis direction. The second gate line 1230 may correspond to the emission control line EL of FIG. 3. Portions of the second gate line 1230, which overlap the first semiconductor layer 1100, may be the driving control gate electrode of the driving control transistor T5 and the emission control gate electrode of the emission control transistor T6. The emission control signal En may be transmitted to the pixels through the second gate line 1230.

The first gate layer 1200 may include metal, an alloy, conductive metal oxide, a transparent conductive material, or the like. For example, the first gate layer 1200 may include Ag, an alloy including Ag, Mo, an alloy including Mo, Al, an alloy including Al, AlN, W, WN, Cu, Ni, Cr, CrN, Ti, Ta, Pt, Sc, ITO, IZO, or the like. The first gate layer 1200 may have a multilayered structure, for example, a two-layer structure of Mo/Al or a three-layer structure of Mo/Al/Mo.

A second interlayer insulating layer 114 (see FIG. 13) may cover the first gate layer 1200 and may be arranged on the first gate insulating layer 113. The second interlayer insulating layer 114 may include the same insulating material as or a similar insulating material to the first gate insulating layer 113.

A second conductive layer 1300 may be on the second interlayer insulating layer 114. The second conductive layer 1300 may include a third gate line 1310, a fourth gate line 1320, a capacitor upper electrode 1330, and a first initialization voltage line 1340 (that is, the first initialization voltage line VL1 of FIG. 3).

The third gate line 1310 may extend in the x-axis direction. The third gate line 1310 may correspond to the previous scan line SLp of FIG. 3. When viewed in the z-axis direction, the third gate line 1310 may be spaced apart from the first gate line 1210. The previous scan signal Sn−1 may be transmitted to the pixels through the third gate line 1310. A portion of the third gate line 1310, which overlaps a second semiconductor layer 1400 described below, may be a first initialization lower gate electrode of the first initialization transistor T4.

The fourth gate line 1320 may also extend in the x-axis direction. The fourth gate line 1320 may correspond to the second scan line SL2 of FIG. 3. When viewed in the z-axis direction, the fourth gate line 1320 may be spaced apart from the first gate line 1210 and the third gate line 1310. The second scan signal Sn' may be transmitted to the pixels through the fourth gate line 1320. A portion of the fourth gate line 1320, which overlaps the second semiconductor layer 1400 described below, may be a compensation lower gate electrode of the compensation transistor T3.

The third gate line 1310 and the fourth gate line 1320 may be arranged under the second semiconductor layer 1400 described below with reference to FIG. 9, and may function as lower protective metals, which protect portions of the second semiconductor layer 1400 that overlap the third gate line 1310 and the fourth gate line 1320, in addition to the gate electrodes.

The capacitor upper electrode 1330 may overlap the first gate electrode 1220 and extend in the x-axis direction. The capacitor upper electrode 1330 may correspond to the second capacitor electrode CE2 of FIG. 3 and form the storage capacitor Cst together with the first gate electrode 1220. The driving voltage ELVDD may be applied to the capacitor upper electrode 1330. Also, a hole 1330-OP penetrating the capacitor upper electrode 1330 may be formed in the capacitor upper electrode 1330, and at least a portion of the first gate electrode 1220 may overlap the hole.

The first initialization voltage line 1340 corresponding to the first initialization voltage line VL1 of FIG. 3 may extend in the x-axis direction. Viewed in the z-axis direction, the first initialization voltage line 1340 may be apart from the third gate line 1310. The first initialization voltage Vint1 may be applied to the pixels through the first initialization voltage line 1340. The first initialization voltage line 1340 may overlap at least a portion of the second semiconductor layer 1400 and may be configured to apply the first initialization voltage Vint1 to the second semiconductor layer 1400. The first initialization voltage line 1340 may be electrically connected to the second semiconductor layer 1400 through contact holes 1680CNT1, 1680CNT2, and 1680CNT3 described below with reference to FIG. 11.

The second conductive layer 1300 may include metal, an alloy, conductive metal oxide, a transparent conductive material, or the like. For example, the second conductive layer 1300 may include Ag, an alloy including Ag, Mo, an alloy including Mo, Al, an alloy including Al, AlN, W, WN, Cu, Ni, Cr, CrN, Ti, Ta, Pt, Sc, ITO, IZO, or the like. The second conductive layer 1300 may have a multilayered structure, for example, a two-layer structure of Mo/Al or a three-layer structure of Mo/Al/Mo.

A third interlayer insulating layer 115 (see FIG. 13) may cover the second conductive layer 1300 and may be arranged on the second interlayer insulating layer 114. The third interlayer insulating layer 115 may include an insulating material. For example, the third interlayer insulating layer 115 may include silicon oxide, silicon nitride, silicon oxynitride, or aluminum oxide.

Figure 9:
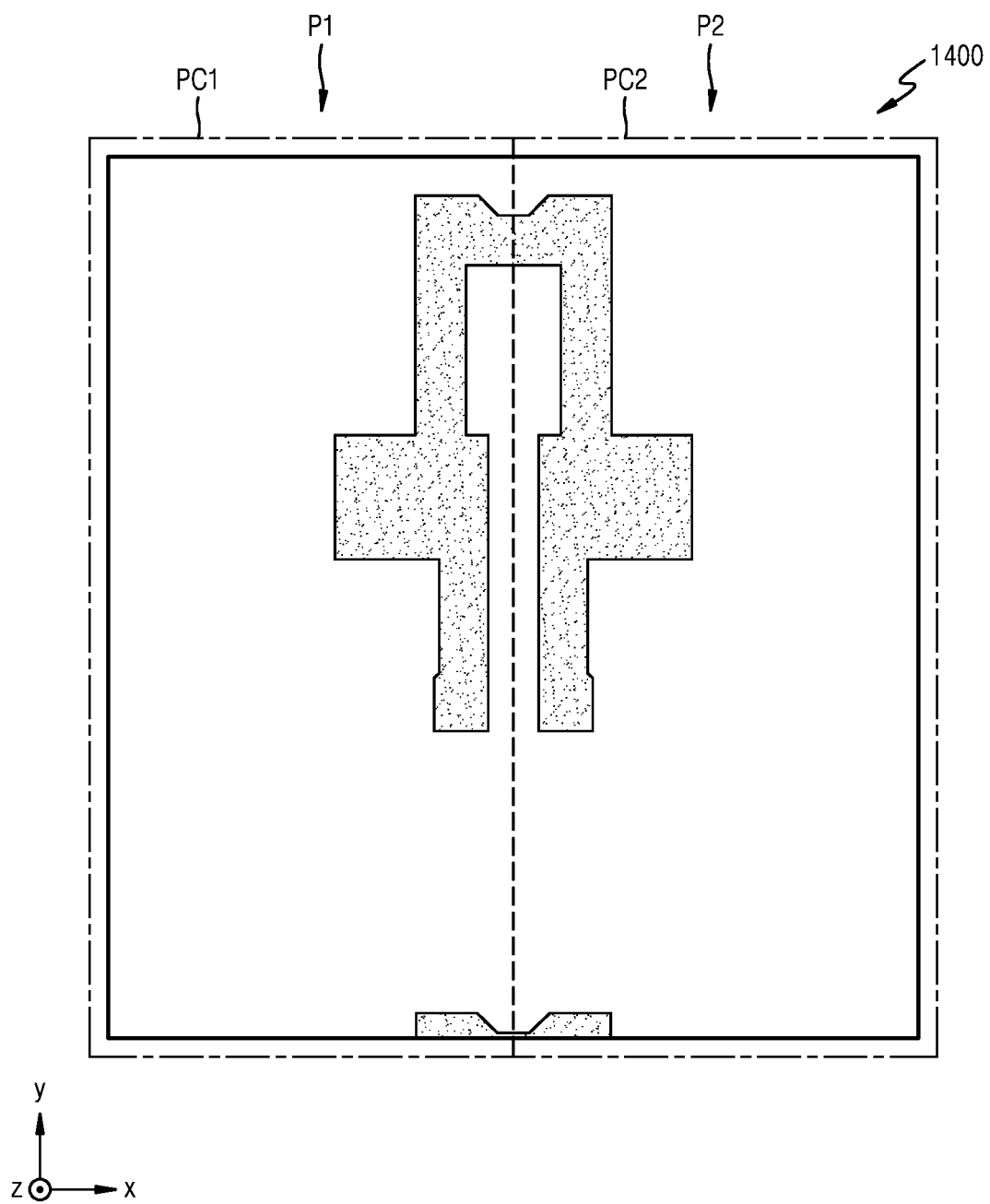

The second semiconductor layer 1400 illustrated in FIG. 9 may be above the third interlayer insulating layer 115. As described above, the second semiconductor layer 1400 may include an oxide semiconductor. The second semiconductor layer 1400 may be at a different level from the first semiconductor layer 1100, and when viewed in the z-axis direction, the second semiconductor layer 1400 may not overlap the first semiconductor layer 1100.

A second gate insulating layer 116 (see FIG. 13) may cover the second semiconductor layer 1400 and may be arranged on the third interlayer insulating layer 115. The second gate insulating layer 116 may include an insulating material. The second gate insulating layer 116 may include silicon oxide, silicon nitride, silicon oxynitride, or aluminum oxide.

Figure 10:
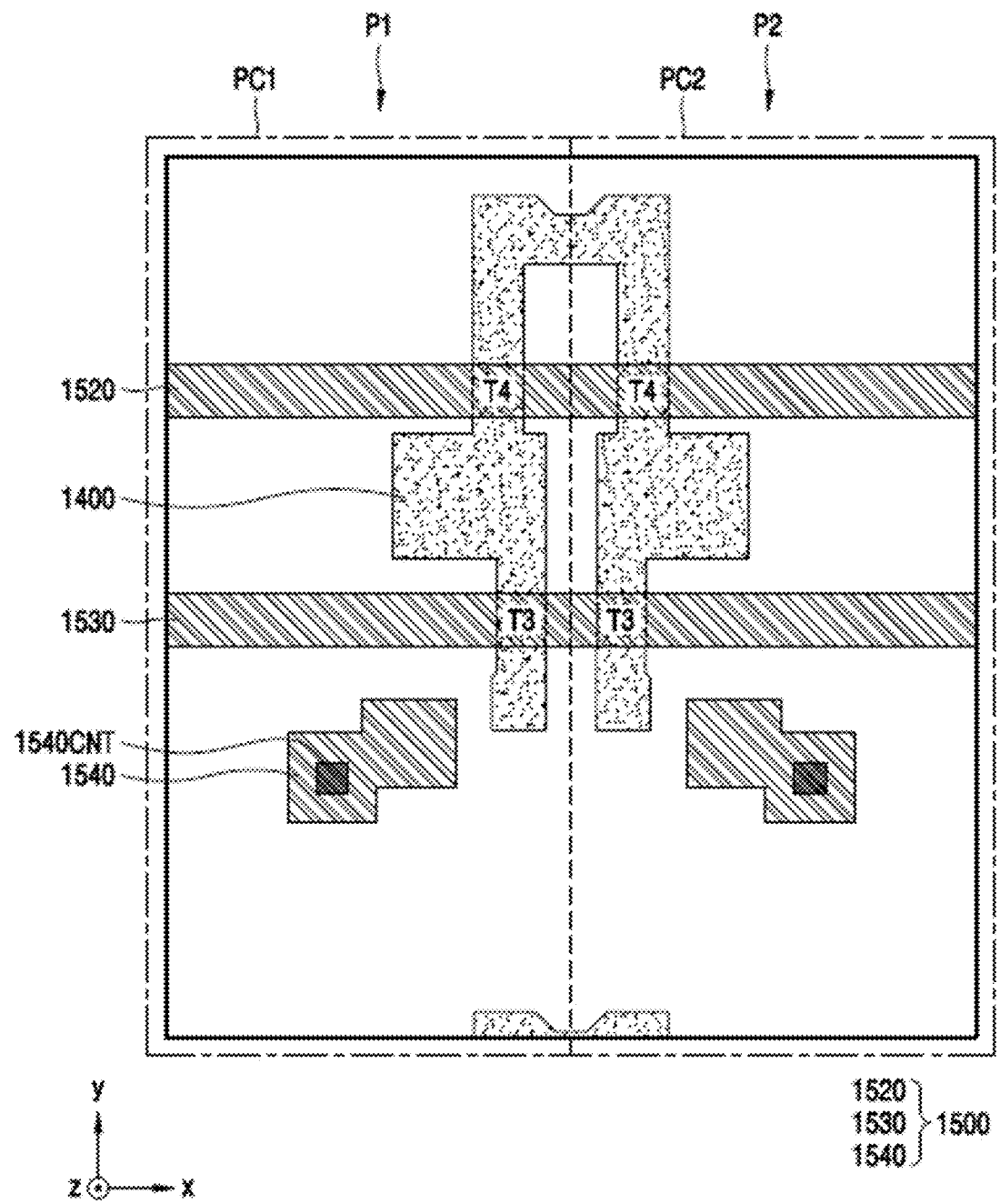

A second gate layer 1500 illustrated in FIG. 10 may be on the second gate insulating layer 116. The second gate layer 1500 may include a fifth gate line 1520, a sixth gate line 1530, and an intermediate electrode 1540.

The fifth gate line 1520 may extend in the x-axis direction. When viewed in the z-axis direction, the fifth gate line 1520 may overlap the third gate line 1310. A portion of the fifth gate line 1520, which overlaps the second semiconductor layer 1400, may be a first initialization upper gate electrode of the first initialization transistor T4. Portions of the second semiconductor layer 1400, which overlaps the fifth gate line 1520, and peripheral portions thereof may be referred to as a first initialization semiconductor layer. The fifth gate line 1520 may be electrically connected to the third gate line 1310. For example, the fifth gate line 1520 may be electrically connected to the third gate line 1310 through a contact hole formed in an insulating layer between the fifth gate line 1520 and the third gate line 1310. Such a contact hole may be in the display area DA or the peripheral area PA. Accordingly, the fifth gate line 1520 may correspond to the previous scan line SLp of FIG. 3 together with the third gate line 1310. Accordingly, the previous scan signal Sn−1 may be transmitted to the pixels through the fifth gate line 1520 and/or the third gate line 1310.

The sixth gate line 1530 may extend in the x-axis direction. When viewed in the z-axis direction, the sixth gate line 1530 may overlap the fourth gate line 1320. A portion of the sixth gate line 1530, which overlaps the second semiconductor layer 1400, may be a compensation upper gate electrode of the compensation transistor T3. The sixth gate line 1530 may be electrically connected to the fourth gate line 1320. For example, the sixth gate line 1530 may be electrically connected to the fourth gate line 1320 through a contact hole formed in an insulating layer between the sixth gate line 1530 and the fourth gate line 1320. Such a contact hole may be in the display area DA or the peripheral area PA. Accordingly, the sixth gate line 1530 may correspond to the second scan line SL2 of FIG. 3 together with the fourth gate line 1320. Accordingly, the second scan signal Sn' may be transmitted to the pixels through the sixth gate line 1530 and/or the fourth gate line 1320.

The intermediate electrode 1540 may be electrically connected to the first gate electrode 1220, which is a driving gate electrode, through a contact hole 1540CNT penetrating an opening 1330-OP of the capacitor upper electrode 1330. The intermediate electrode 1540 may transmit, to the first gate electrode 1220, the first initialization voltage Vint1 transmitted through the first initialization transistor T4.

The second gate layer 1500 may include metal, an alloy, conductive metal oxide, a transparent conductive material, or the like. For example, the second gate layer 1500 may include Ag, an alloy including Ag, Mo, an alloy including Mo, Al, an alloy including Al, AlN, W, WN, Cu, Ni, Cr, CrN, Ti, Ta, Pt, Sc, ITO, IZO, or the like. The second gate layer 1500 may have a multilayered structure, for example, a two-layer structure of Mo/Al or a three-layer structure of Mo/Al/Mo.

A fourth interlayer insulating layer 117 (see FIG. 13) may cover at least a portion of the second gate layer 1500 of FIG. 10. The fourth interlayer insulating layer 117 may include an insulating material. For example, the fourth interlayer insulating layer 117 may include silicon oxide, silicon nitride, silicon oxynitride, or aluminum oxide.

Figure 11:
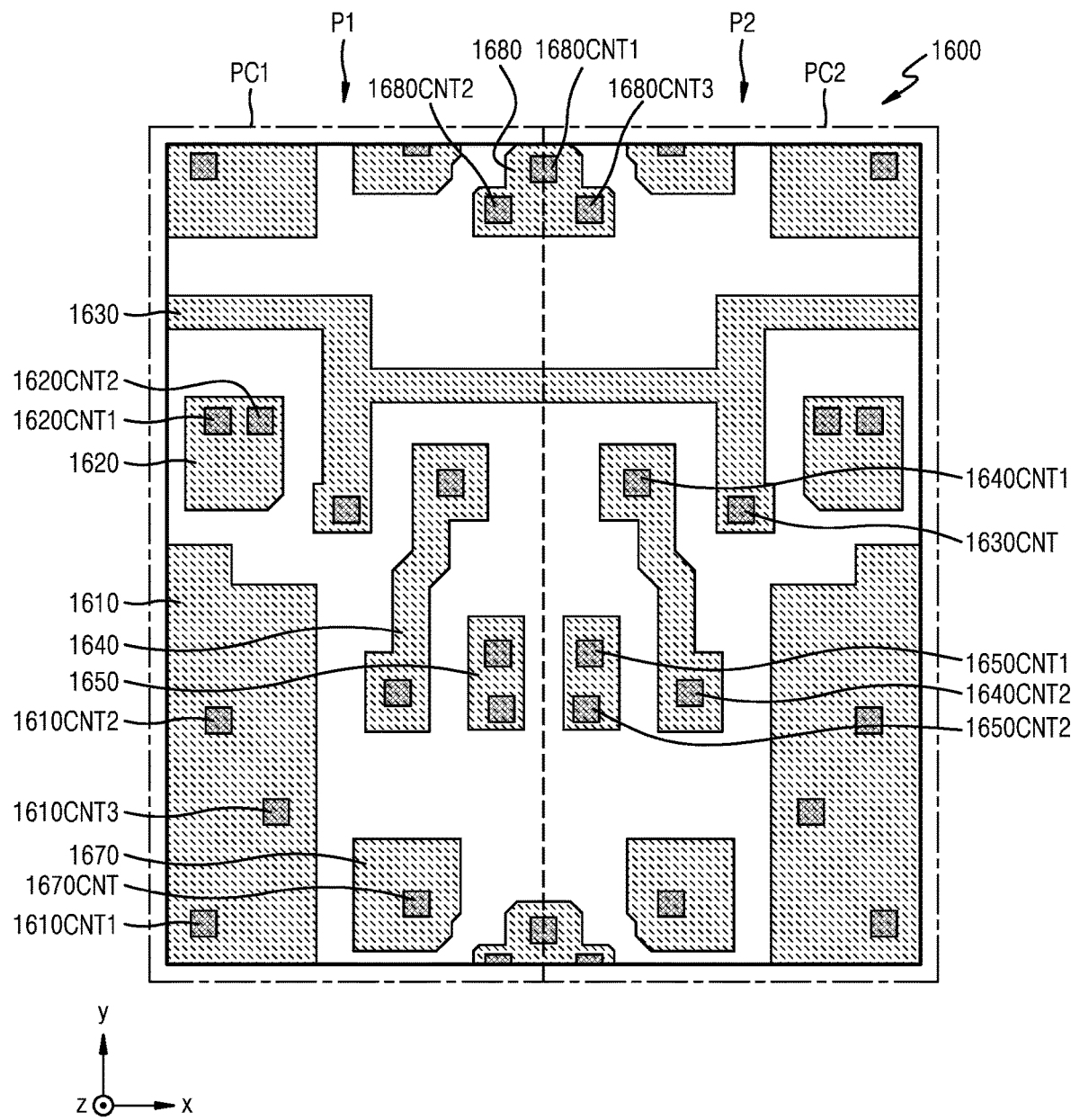

A first connection electrode layer 1600 illustrated in FIG. 11 may be arranged on the fourth interlayer insulating layer 117. The first connection electrode layer 1600 may include a first connection electrode 1620, a second connection electrode 1610, a second initialization voltage line 1630, a third connection electrode 1670, a fourth connection electrode 1640, a fifth connection electrode 1650, and a sixth connection electrode 1680.

The first connection electrode 1620 may be electrically connected to the first semiconductor layer 1100 through a contact hole. For example, the first connection electrode 1620 may be electrically connected to the first semiconductor layer 1100 through the contact hole 1620CNT1 formed in the first gate insulating layer 113, the second interlayer insulating layer 114, the third interlayer insulating layer 115, the second gate insulating layer 116, and the fourth interlayer insulating layer 117. The data signal Dm, which is transmitted through the data line 1710 described below with reference to FIG. 12, may be transmitted to the first semiconductor layer 1100 through the first connection electrode 1620 and applied to the switching transistor T2.

Also, the first connection electrode 1620 may be electrically connected to the auxiliary data line 1010 through a contact hole 1620CNT2. For example, the first connection electrode 1620 may be electrically connected to the auxiliary data line 1010 through the contact hole 1620CNT2 formed in the first interlayer insulating layer 112, the first gate insulating layer 113, the second interlayer insulating layer 114, the third interlayer insulating layer 115, the second gate insulating layer 116, and the fourth interlayer insulating layer 117 which are between the first connection electrode layer 1600 and the first conductive layer 1000. Accordingly, the data line 1710, which is described below with reference to FIG. 13, may be electrically connected to the auxiliary data line 1010.

The second initialization voltage line 1630 may extend in the x-axis direction. The second initialization voltage line 1630 corresponding to the second initialization voltage line VL2 of FIG. 3 may be configured to transmit the second initialization voltage Vint2 to the pixels. The second initialization voltage line 1630 may be electrically connected to the first semiconductor layer 1100 through a contact hole 1630CNT, and thus, the second initialization voltage line VL2 may be transmitted to the first semiconductor layer 1100 and then applied to the second initialization transistor T7.

The second connection electrode 1610 may be electrically connected to the first semiconductor layer 1100 through a contact hole 1610CNT1. For example, the second connection electrode 1610 may be electrically connected to the first semiconductor layer 1100 through the contact hole 1610CNT1 formed in the first gate insulating layer 113, the second interlayer insulating layer 114, the third interlayer insulating layer 115, the second gate insulating layer 116, and the fourth interlayer insulating layer 117. The driving voltage ELVDD transmitted through the driving voltage line 1730 described below with reference to FIG. 12 may be transmitted to the first semiconductor layer 1100 through the second connection electrode 1610 and then may be applied to the driving control transistor T5.

Also, the second connection electrode 1610, which is electrically connected to the capacitor upper electrode 1330 (that is, the second capacitor electrode CE2 of FIG. 3) through the contact hole 1610CNT2 that is an additional contact hole, may transmit the driving voltage ELVDD to the capacitor upper electrode 1330.

Also, the second connection electrode 1610 may be electrically connected to the shielding layer 1020 through a contact hole 1610CNT3. For example, the second connection electrode 1610 may be electrically connected to the shielding layer 1020 through the contact hole 1610CNT3 formed in the first interlayer insulating layer 112, the first gate insulating layer 113, the second interlayer insulating layer 114, the third interlayer insulating layer 115, the second gate insulating layer 116, and the fourth interlayer insulating layer 117 which are between the first connection electrode layer 1600 and the first conductive layer 1000. Accordingly, the driving voltage line 1730 described with reference to FIG. 14 may be electrically connected to the shielding layer 1020.

The third connection electrode 1670 may be electrically connected to the first semiconductor layer 1100 through a contact hole 1670CNT. The third connection electrode 1670 may transmit, to the organic light-emitting diode OLED, the driving current or the second initialization voltage Vint2 from the first semiconductor layer 1100.

The fourth connection electrode 1640 may electrically connect the second semiconductor layer 1400 to the intermediate electrode 1540 through contact holes 1640CNT1 and 1640CNT2 formed in one side and the other side of the fourth connection electrode 1640. Because the intermediate electrode 1540 is electrically connected to the first gate electrode 1220 that is the driving gate electrode, the fourth connection electrode 1640 may eventually electrically connect the first initialization semiconductor layer, which is a portion of the second semiconductor layer 1400, to the driving gate electrode. The first initialization voltage Vint1 may be transmitted to the first gate electrode 1220, which is the driving gate electrode, through the second semiconductor layer 1400, the fourth connection electrode 1640, and the intermediate electrode 1540.

The fifth connection electrode 1650 may electrically connect the second semiconductor layer 1400 to the first semiconductor layer 1100 through contact holes 1650CNT1 and 1650CNT2 formed in one side and the other side of the fifth connection electrode 1650. That is, the fifth connection electrode 1650 may electrically connect the compensation transistor T3 to the driving transistor T1.

The sixth connection electrode 1680 may be electrically connected to the second semiconductor layer 1400 through contact holes 1680CNT2 and 1680CNT3. The sixth connection electrode 1680 may be electrically connected to the first initialization voltage line 1340 of FIG. 7 through a contact hole 1680CNT1. To this end, the sixth connection electrode 1680 may transmit, to the first initialization transistor T4, the first initialization voltage Vint1 transmitted through the first initialization voltage line 1340.

The first connection electrode layer 1600 may include metal, an alloy, conductive metal oxide, a transparent conductive material, or the like. For example, the first connection electrode layer 1600 may include Ag, an alloy including Ag, Mo, an alloy including Mo, Al, an alloy including Al, AlN, W, WN, Cu, Ni, Cr, CrN, Ti, Ta, Pt, Sc, ITO, IZO, or the like. The first connection electrode layer 1600 may have a multilayered structure, for example, a two-layer structure of Mo/Al or a three-layer structure of Mo/Al/Mo.

A first planarization layer 118 may cover the first connection electrode layer 1600 and may be arranged on the fourth interlayer insulating layer 117. The first planarization layer 118 may include an organic insulating material. For example, the first planarization layer 118 may include photoresist, benzocyclobutene (BCB), polyimide, hexamethyldisiloxane (HMDSO), polymethylmethacrylate (PMMA), polystyrene, a polymer derivative having a phenol-based group, an acryl-based polymer, an imide-based polymer, an aryl-ether-based polymer, an amide-based polymer, a fluorine-based polymer, a p-xylene-based polymer, a vinyl alcohol-based polymer, and any blend thereof.

The second gate electrode layer 1700 illustrated in FIG. 12 may be on the first planarization layer 118. The second gate electrode layer 1700 may include the data line 1710, the driving voltage line 1730, and an upper connection electrode 1740.

The data line 1710 may extend in the y-axis direction. The data line 1710 may correspond to the data line DL of FIG. 3. The data line 1710 may be electrically connected to the first connection electrode 1620 through a contact hole 1710CNT, and the data signal Dm from the data line 1710 may be transmitted to the first semiconductor layer 1100 through the first connection electrode 1620 and then applied to the switching transistor T2.

The data line 1710 may be electrically connected to the auxiliary data line 1010. For example, the data line 1710 may be electrically connected to the first connection electrode 1620 through the contact hole 1710CNT formed in the first planarization layer 118 arranged between the second gate electrode layer 1700 and the first connection electrode layer 1600. Also, the first connection electrode 1620 may be electrically connected to the auxiliary data line 1010 through the contact hole 1620CNT2 formed in the first interlayer insulating layer 112, the first gate insulating layer 113, the second interlayer insulating layer 114, the third interlayer insulating layer 115, the second gate insulating layer 116, and the fourth interlayer insulating layer 117 which are between the first connection electrode layer 1600 and the first conductive layer 1000.

Because the data line 1710 is electrically connected to the first connection electrode 1620 and the first connection electrode 1620 is electrically connected to the auxiliary data line 1010, the data line 1710 may be electrically connected to the auxiliary data line 1010. The first connection electrode 1620 may transmit the data signal Dm from the data line 1710 to the auxiliary data line 1010.

The driving voltage line 1730 may extend substantially in the y-axis direction. The driving voltage line 1730 may correspond to the driving voltage line PL of FIG. 3. The driving voltage line 1730 may be configured to apply the driving voltage ELVDD to the pixels. The driving voltage line 1730 may be electrically connected to the second connection electrode 1610 through a contact hole 1730CNT, and as described above, the driving voltage ELVDD may be transmitted to the driving control transistor T5 and the capacitor upper electrode 1330.

The driving voltage line 1730 may be electrically connected to the shielding layer 1020. For example, the driving voltage line 1730 may be electrically connected to the second connection electrode 1610 through the contact hole 1730CNT formed in the first planarization layer 118 arranged between the second connection electrode layer 1700 and the first connection electrode layer 1600. Also, the second connection electrode 1610 may be electrically connected to the shielding layer 1020 through the contact hole 1610CNT3 formed in the first interlayer insulating layer 112, the first gate insulating layer 113, the second interlayer insulating layer 114, the third interlayer insulating layer 115, the second gate insulating layer 116, and the fourth interlayer insulating layer 117 which are between the first connection electrode layer 1600 and the first conductive layer 1000.

Because the driving voltage line 1730 is electrically connected to the second connection electrode 1610 and the second connection electrode 1610 is electrically connected to the shielding layer 1020, the driving voltage line 1730 may be electrically connected to the shielding layer 1020. The second connection electrode 1610 may transmit, to the shielding layer 1020, the driving voltage ELVDD transmitted through the driving voltage line 1730. The driving voltage line 1730 of the first pixel circuit PC1 may be integrally formed with the driving voltage line 1730 of the second pixel circuit PC2 that is adjacent to the first pixel circuit PC1.

The upper connection electrode 1740 may be electrically connected to the third connection electrode 1670 through a contact hole 1740CNT1. The upper connection electrode 1740 is connected to a pixel electrode 210 (see FIG. 13) through the contact hole 1740CNT1 formed in an insulating layer arranged on the upper connection electrode 1740. Accordingly, the driving current or the second initialization voltage Vint2 from the first semiconductor layer 1100 may be transmitted to the first electrode (the pixel electrode) of the organic light-emitting diode OLED through the third connection electrode 1670 and the upper connection electrode 1740.

The second connection electrode layer 1700 may include metal, an alloy, conductive metal oxide, a transparent conductive material, or the like. For example, the second connection electrode layer 1700 may include Ag, an alloy including Ag, Mo, an alloy including Mo, Al, an alloy including Al, AlN, W, WN, Cu, Ni, Cr, CrN, Ti, Ta, Pt, Sc, ITO, IZO, or the like. The second connection electrode layer 1700 may have a multilayered structure, for example, a two-layer structure of Ti/Al or a three-layer structure of Ti/Al/Ti.

A second planarization layer 119 (see FIG. 13) may cover the second connection electrode layer 1700 and may be arranged on the first planarization layer 118. The second planarization layer 119 may include an organic insulating material. For example, the second planarization layer 119 may include photoresist, BCB, polyimide, HMDSO, PMMA, polystyrene, a polymer derivative having a phenol-based group, an acryl-based polymer, an imide-based polymer, an aryl-ether-based polymer, an amide-based polymer, a fluorine-based polymer, a p-xylene-based polymer, a vinyl alcohol-based polymer, and any blend thereof.

The organic light-emitting diode OLED may be arranged on the second planarization layer 119. The organic light-emitting diode OLED may include the pixel electrode 210, the intermediate layer 220 including an emission layer, and the opposite electrode 230.

The pixel electrode 210 may be a (semi-) light-transmissive electrode or a reflection electrode. For example, the pixel electrode 210 may include a reflection layer including Ag, Mg, Al, Pt, Pd, Au, Ni, Nd, Ir, Cr, and a compound thereof, and a transparent or translucent electrode layer arranged on the reflection layer. The transparent or translucent electrode layer may include at least one selected from the group consisting of ITO, IZO, zinc oxide (ZnO), indium oxide ($In_2O_3$), indium gallium oxide (IGO), and aluminum zinc oxide (AZO). For example, the pixel electrode 210 may have a three-layer structure of ITO/Ag/ITO.

A pixel-defining layer 120 may be arranged on the second planarization layer 119. The pixel-defining layer 120 may prevent arcs, etc. from being generated at edges of the pixel electrode 210 by increasing a distance between the edges of the pixel electrode 210 and the opposite electrode 230 arranged above the pixel electrode 210. The pixel-defining layer 120 may include at least one organic insulating material selected from the group consisting of polyimide, polyamide, acryl resin, BCB, and phenol resin, and may be formed according to a spin coating method, etc.

At least a portion of the intermediate layer 220 of the organic light-emitting diode OLED may be in an opening formed by the pixel-defining layer 120. An emission area of the organic light-emitting diode OLED may be defined by the opening.

The intermediate layer 220 may include an emission layer. The emission layer may include an organic material including a fluorescent or phosphorescent material emitting red light, green light, blue light, or white light. The emission layer may include a low-molecular-weight or a high-molecular-weight organic material, and functional layers such as a hole transport layer (HTL), a hole injection layer (HIL), an electron transport layer (ETL), and an electron injection layer (EIL) may be selectively arranged under and on the emission layer.

The emission layer may have a shape patterned according to each of the pixel electrodes 210. Various modifications may be made to layers of the intermediate layer 220, other than the emission layer. For example, the layers of the intermediate layer 220 may be integrally formed over the plurality of pixel electrodes 210.

The opposite electrode 230 may be a light-transmissive electrode or a reflection electrode. For example, the opposite electrode 230 may be a transparent or translucent electrode and may include a metal thin-film having a low work function and including Li, Ca, LiF, Al, Ag, Mg, and a compound thereof. Also, the opposite electrode 230 may further include a Transparent Conductive Oxide (TCO) layer including ITO, IZO, ZnO, or $In_2O_3$ and arranged on the metal thin film. The opposite electrode 230 may be integrally formed in the entire display area DA and arranged on the intermediate layer 220 and the pixel-defining layer 120.

FIG. 13 is a schematic cross-sectional view of the display apparatus of FIG. 4, taken along line I-I' of FIG. 4.

As illustrated in FIG. 13, the data line 1710 may be electrically connected to the first semiconductor layer 1100. For example, the data line 1710 may be physically and directly connected to the first connection electrode 1620 through the contact hole 1710CNT formed in the first planarization layer 118 arranged between the second connection electrode layer 1700 and the first connection electrode layer 1600. Also, as the first connection electrode 1620 electrically connected to the data line 1710 is physically and directly connected to the auxiliary data line 1010 through the contact hole 1620CNT1 formed in the first gate insulating layer 113, the second interlayer insulating layer 114, the third interlayer insulating layer 115, the second gate insulating layer 116, and the fourth interlayer insulating layer 117, which are between the first connection electrode layer 1600 and the first conductive layer 1000, the data line 1710 may be electrically connected to the first semiconductor layer 1100. That is, the data line 1710 may be electrically connected to the first semiconductor layer 1100 of the switching transistor T2.

As the data line 1710 is configured to provide the data signal Dm to the first semiconductor layer 1100 of the switching transistor T2 through the first connection electrode 1620, the driving current may be provided to the organic light-emitting diode OLED. However, in the case of a high-definition display, as an area occupied by one pixel decreases, an area occupied by the data line 1710 may also decrease. When the area of the data line 1710 decreases, an electrical resistance inside the data line 1710 may increase, and accordingly, it is not easy to realize a display apparatus for displaying a high-quality image. For example, although a data signal Dm, which is configured to emit light having the same brightness, is applied to pixels arranged in the same column and connected to the same data line 1710, electrical signals that are actually applied to the pixels may differ because of a voltage drop caused by the resistance of the data line 1710. Accordingly, the pixels may emit light having unintendedly different brightness, and thus, a high-quality image may not be displayed.

However, in the case of a display apparatus according to the present embodiment, the first connection electrode 1620 may be physically and directly connected to the auxiliary data line 1010 through the contact hole 1620CNT2 formed in the first interlayer insulating layer 112, the first gate insulating layer 113, the second interlayer insulating layer 114, the third interlayer insulating layer 115, the second gate insulating layer 116, and the fourth interlayer insulating layer 117 which are between the first connection electrode layer 1600 and the first conductive layer 1000. Because the data line 1710 is physically and directly connected to the first connection electrode 1620 and the first connection electrode 1620 is physically and directly connected to the auxiliary data line 1010, the data line 1710 may be electrically connected to the auxiliary data line 1010.

The total area of lines configured to transmit the data signal Dm may increase by electrically connecting the data line 1710 to the auxiliary data line 1010. Accordingly, the total electrical resistance of the lines configured to transmit the data signal Dm may decrease, and the data signal Dm generated by the controller may be identical or similar to a signal that is finally provided to the switching transistor T2 of each pixel. Accordingly, the brightness of each pixel may be appropriately controlled.

FIG. 14 is a schematic cross-sectional view of the display apparatus of FIG. 4, taken along line II-II' of FIG. 4.

As illustrated in FIG. 14, the driving voltage line 1730 may be electrically connected to the first semiconductor layer 1100. For example, the driving voltage line 1730 may be physically and directly connected to the second connection electrode 1610 through the contact hole 1730CNT1 formed in the first planarization layer 118 between the second connection electrode layer 1700 and the first connection electrode layer 1600. Also, as the second connection electrode 1610 electrically connected to the driving voltage line 1730 is physically and directly connected to the shielding layer 1020 through the contact hole 1610CNT1 formed in the first gate insulating layer 113, the second interlayer insulating layer 114, the third interlayer insulating layer 115, the second gate insulating layer 116, and the fourth interlayer insulating layer 117 which are between the first connection electrode layer 1600 and the first semiconductor layer 1100, the driving voltage line 1730 may be electrically connected to the first semiconductor layer 1100. That is, the driving voltage line 1730 may be electrically connected to the first semiconductor layer 1100 of the driving control transistor T5.

As the driving voltage line 1730 is configured to provide the driving voltage ELVDD to the first semiconductor layer 1100 of the driving control transistor T5, the driving current may be provided to the organic light-emitting diode OLED. However, in the case of a high-definition display, an area occupied by one pixel decreases, and thus, an area occupied by the driving voltage line 1730 may also decrease. When the area of the driving voltage line 1730 decreases, the electrical resistance inside the driving voltage line 1730 may increase. Thus, although the driving voltage EVLDD, which is configured to emit light having the same brightness, is applied to pixels arranged in the same column and connected to the same driving voltage line 1730, electrical signals that are actually applied to the pixels may differ because of a voltage drop caused by the resistance of the driving voltage line 1730. Accordingly, the pixels may emit light having unintendedly different brightness, and thus, a high-quality image may not be displayed.

However, in the case of the display apparatus according to the present embodiment, the second connection electrode 1610 may be physically and directly connected to the shielding layer 1020 the contact hole 1610CNT3 formed in the first interlayer insulating layer 112, the first gate insulating layer 113, the second interlayer insulating layer 114, the third interlayer insulating layer 115, the second gate insulating layer 116, and the fourth interlayer insulating layer 117 which are between the first connection electrode layer 1600 and the first conductive layer 1000. Because the driving voltage line 1730 is physically and directly connected to the second connection electrode 1610 and the second connection electrode 1610 is physically and directly connected to the shielding layer 1020, the driving voltage line 1730 may be electrically connected to the shielding layer 1020.

As the driving voltage line 1730 is electrically connected to the shielding layer 1020, the total area of lines configured to transmit the driving voltage ELVDD may increase. Accordingly, the electrical resistance of the lines configured to transmit the driving voltage ELVDD may decrease, and the driving voltage ELVDD generated by the controller may be identical or similar to a voltage that is finally provided to the driving control transistor T5 of each pixel. Therefore, the brightness of each pixel may be appropriately controlled.

FIG. 15 is a schematic cross-sectional view of the display apparatus of FIG. 4, taken along line of FIG. 4.

As illustrated in FIG. 15, the first interlayer insulating layer 112, the first gate insulating layer 113, the second interlayer insulating layer 114, the third interlayer insulating layer 115, the second gate insulating layer 116, and the fourth interlayer insulating layer 117 may include a first groove G1 extending in the first direction, and the first planarization layer 118 may fill the first groove G1. For example, the first direction may be the y-axis direction, and a depth of a groove may be less than the total thickness of insulating layers. However, the inventive concepts are not limited thereto.

When the external impact is applied to the display apparatus, cracks may be generated in the insulating layers including inorganic materials and included in the display apparatus. The cracks in a pixel area may propagate according to the insulating layers of the display apparatus that include inorganic materials, thus extending to an adjacent pixel area. Accordingly, defects may occur in the pixels.

In the case of the display apparatus according to the present embodiment, the first interlayer insulating layer 112, the first gate insulating layer 113, the second interlayer insulating layer 114, the third interlayer insulating layer 115, the second gate insulating layer 116, and the fourth interlayer insulating layer 117 include the first groove G1 extending in the first direction, as described above. Accordingly, although cracks are generated in the insulating layers including inorganic materials in an area of the first pixel P1 because of external impact, and although the cracks propagate according to the insulating layers including the inorganic materials, such cracks may extend only to the first groove G1 of the insulating layers. Therefore, the cracks generated in the area of the first pixel P1 may not propagate into an area of the second pixel P2. Therefore, in the display apparatus according to the present embodiment, cracks, which are generated in insulating layers including inorganic materials in one pixel because of external impact, may be effectively prevented from propagating to an adjacent pixel or the propagation of the cracks may be reduced.

FIG. 16 is a schematic plan view of the first groove G1 and the second groove G2 in pixels included in a display apparatus, according to an embodiment.

As illustrated in FIG. 16, the first interlayer insulating layer 112, the first gate insulating layer 113, the second interlayer insulating layer 114, the third interlayer insulating layer 115, the second gate insulating layer 116, and the fourth interlayer insulating layer 117 may further include the second groove G2 extending in a second direction crossing the first direction. For example, the first direction may be the y-axis direction, and the second direction may be the x-axis direction. A depth of a groove may be less than the total thickness of the insulating layers. That is, an insulating layer of each pixel may be surrounded by the groove, and thus, insulating layers of adjacent pixels may not contact and be apart from each other.

Therefore, in the case of the display apparatus according to the present embodiment, although cracks may appear in insulating layers including inorganic materials in an area of the first pixel P1 because of external impact, and although the cracks propagate according to the insulating layers including the inorganic materials, such cracks may extend in a direction towards the second pixel P2 and stop in the first groove G1, or may extend in a direction towards a third pixel P3 and stop in the second groove G2. Accordingly, because the cracks generated in the area of the first pixel P1 do not propagate to an area of the second pixel P2, an area of a third pixel P3, and an area of a fourth pixel P4, an occurrence rate of defects caused by the external impact may decrease.

As described above, according to the one or more embodiments, a display apparatus in which a high-resolution image is displayed with a low occurrence rate of defects caused by a voltage drop may be realized. The scope of the invention is not limited by the effects.

Although certain embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A display apparatus comprising:
    a substrate;
    a first conductive layer arranged on the substrate and comprising an auxiliary data line extending in a first direction;
    a first semiconductor layer arranged on the first conductive layer;
    a first gate layer arranged on the first semiconductor layer;
    a first connection electrode layer arranged on the first gate layer and comprising a first connection electrode electrically connected to the first semiconductor layer and the auxiliary data line; and
    a second connection electrode layer arranged on the first connection electrode layer and comprising a data line electrically connected to the first connection electrode.

2. The display apparatus of claim 1, further comprising a planarization layer arranged between the first connection electrode layer and the second connection electrode layer,
    wherein the data line is connected to the first connection electrode, which is included in the first connection electrode layer, through a contact hole in the planarization layer.

3. The display apparatus of claim 1, further comprising:
    a first interlayer insulating layer arranged between the first conductive layer and the first semiconductor layer;
    a first gate insulating layer arranged between the first semiconductor layer and the first gate layer;
    a second interlayer insulating layer configured to cover the first gate layer;
    a second conductive layer arranged on the second interlayer insulating layer;
    a third interlayer insulating layer configured to cover the second conductive layer;
    a second semiconductor layer arranged on the third interlayer insulating layer;
    a second gate insulating layer configured to cover the second semiconductor layer;
    a second gate layer arranged on the second gate insulating layer;
    a fourth interlayer insulating layer configured to cover the second gate layer; and a planarization layer arranged between the first connection electrode layer and the second connection electrode layer, wherein the first connection electrode layer is arranged on the fourth interlayer insulating layer.

4. The display apparatus of claim 3, wherein the first connection electrode is connected to the first semiconductor layer through a contact hole in the first gate insulating layer, the second interlayer insulating layer, the third interlayer insulating layer, the second gate insulating layer, and the fourth interlayer insulating layer.

5. The display apparatus of claim 3, wherein the first connection electrode is connected to the auxiliary data line through a contact hole in the first interlayer insulating layer, the first gate insulating layer, the second interlayer insulating layer, the third interlayer insulating layer, the second gate insulating layer, and the fourth interlayer insulating layer.

6. The display apparatus of claim 1, wherein an electrical signal, which is a same as an electrical signal transmitted to the data line, is transmitted to the auxiliary data line.

7. The display apparatus of claim 1, wherein the data line extends in the first direction.

8. The display apparatus of claim 1, wherein a width of some portions of the auxiliary data line is different from a width of other portions of the auxiliary data line.

9. The display apparatus of claim 1, wherein the auxiliary data line is directly and physically connected to the first connection electrode, and the first connection electrode is directly and physically connected to the data line.

10. The display apparatus of claim 3, wherein:
the first conductive layer further comprises a shielding layer; and
the shielding layer comprises a pattern having an island shape and a connection line extending from the pattern in the first direction.

11. The display apparatus of claim 10, wherein:
the second connection electrode layer further comprises a driving voltage line; and
the driving voltage line is electrically connected to the shielding layer.

12. The display apparatus of claim 11, wherein:
the first connection electrode layer further comprises a second connection electrode; and
the driving voltage line is connected to the second connection electrode through a contact hole in the planarization layer.

13. The display apparatus of claim 12, wherein the second connection electrode is connected to the first semiconductor layer through a contact hole in the first gate insulating layer, the second interlayer insulating layer, the third interlayer insulating layer, the second gate insulating layer, and the fourth interlayer insulating layer.

14. The display apparatus of claim 12, wherein the second connection electrode is connected to the shielding layer through a contact hole in the first interlayer insulating layer, the first gate insulating layer, the second interlayer insulating layer, the third interlayer insulating layer, the second gate insulating layer, and the fourth interlayer insulating layer.

15. The display apparatus of claim 11, wherein an electrical signal, which is a same as an electrical signal transmitted to the driving voltage line, is transmitted to the shielding layer.

16. The display apparatus of claim 10, wherein the shielding layer comprises a same material as the auxiliary data line.

17. The display apparatus of claim 10, wherein the shielding layer has a same layer structure as the auxiliary data line.

18. The display apparatus of claim 10, wherein an electrical signal, which is different from an electrical signal transmitted to the auxiliary data line, is transmitted to the shielding layer.

19. The display apparatus of claim 3, wherein:
the first interlayer insulating layer, the first gate insulating layer, the second interlayer insulating layer, the third interlayer insulating layer, the second gate insulating layer, and the fourth interlayer insulating layer comprise a first groove extending in the first direction; and
the planarization layer is configured to fill the first groove.

20. The display apparatus of claim 19, wherein:
the first interlayer insulating layer, the first gate insulating layer, the second interlayer insulating layer, the third interlayer insulating layer, the second gate insulating layer, and the fourth interlayer insulating layer further comprise a second groove extending in a second direction crossing the first direction; and
the planarization layer is configured to fill the second groove.

* * * * *